United States Patent [19]

Soejima

[11] Patent Number: 5,717,244

[45] Date of Patent: Feb. 10, 1998

[54] SEMICONDUCTOR DEVICE HAVING LAYERS WITH VARYING LIFETIME CHARACTERISTICS

[75] Inventor: Noriyuki Soejima, Fukuoka, Japan

[73] Assignee: Mitsubishi Denki Kabushiki Kaisha, Tokyo, Japan

[21] Appl. No.: 533,753

[22] Filed: Sep. 26, 1995

[30] Foreign Application Priority Data

Oct. 25, 1994  [JP]  Japan ................... 6-260541

[51] Int. Cl.$^6$ ............... H01L 29/207; H01L 29/227; H01L 31/0288; H01L 31/111
[52] U.S. Cl. .............. 257/617; 257/156; 257/577; 257/612; 257/655; 257/656; 257/657
[58] Field of Search ................... 257/577, 612, 257/617, 655, 656, 657, 156

[56] References Cited

U.S. PATENT DOCUMENTS

| | | | |
|---|---|---|---|
| 4,259,683 | 3/1981 | Adler et al. | 357/64 |
| 4,594,602 | 6/1986 | Iimura et al. | 357/13 |
| 4,752,818 | 6/1988 | Kushida et al. | 357/38 |

FOREIGN PATENT DOCUMENTS

| | | | |
|---|---|---|---|
| 61423142 | 9/1994 | European Pat. Off. | 257/657 |
| 60-198778 | 10/1985 | Japan . | |
| 401093167 | 4/1989 | Japan | 257/655 |
| 3-171777 | 7/1991 | Japan . | |
| 4-348527 | 12/1992 | Japan . | |

*Primary Examiner*—Wael Fahmy
*Assistant Examiner*—Howard Weiss
*Attorney, Agent, or Firm*—Oblon, Spivak, McClelland, Maier & Neustadt, P.C.

[57] ABSTRACT

An $N^-$ layer (11) of a low impurity concentration is formed on an upper major surface of an $N^+$ layer (13) of a high impurity concentration in a diode (10). A P layer (12) is further formed on its upper major surface. The $N^-$ layer (11) is in a multilayer structure of first to third regions (11a to 11c) having carrier lifetimes $\tau_1$, $\tau_2$ and $\tau_3$ respectively. These lifetimes are in relation $\tau_2 < \tau_1 < \tau_3$. Due to the large lifetime $\tau_3$ of the third region (11c), soft recovery can be implemented. The fact that the lifetime $\tau_3$ of the third region (11c) is large serves as a factor reducing a forward voltage $V_F$. It is possible to attain soft recovery without increasing the forward voltage $V_F$ by properly designing these lifetimes and thicknesses.

4 Claims, 16 Drawing Sheets

1

SEMICONDUCTOR DEVICE HAVING LAYERS WITH VARYING LIFETIME CHARACTERISTICS

BACKGROUND OF THE INVENTION

1. Field of the Invention

The present invention relates to an improvement of a semiconductor device forming a diode, in particular.

2. Description of the Background Art

FIG. 25 is a sectional view showing the structure of a conventional diode 100. In the diode 100, an N$^-$ layer 1 of a low impurity concentration is formed on an upper major surface of an N$^+$ substrate 3 of a high impurity concentration. Further, a P layer 2 is formed on an upper major surface of the N$^-$ layer 1. In addition, an anode electrode 4 and a cathode electrode 5 are formed on surfaces of the P layer 2 and the N$^+$ substrate 3 respectively.

FIG. 26 is a graph showing an operating current waveform of the diode 100. Even if a circuit (not shown) for applying a voltage to the diode 100 tries to switch the polarity of the voltage which is supplied to the diode 100 at a time $t_s$, a forward current $I_F$ flows reducing a while, to be zeroed at a time $t_0$.

A current following the time $t_0$ is a reverse recovery current $I_\pi$. When the diode 100 is applied to a circuit device such as an inverter, a surge voltage $V_{surge}$ is generated as follows, by a time change rate $dI_{90}/dt$ (corresponding to inclination of the tangent of $I_\pi$ in FIG. 26) of the reverse recovery current and an inductance component L of the circuit after reaching a peak $I_{RM}$ of the reverse recovery current $I_\pi$:

$$V_{surge} = -L \cdot (dI_\pi/dt)$$

From this equation, the surge voltage $V_{surge}$ may be increased to hinder the design of the circuit device in case of such a waveform that the absolute value of the time change rate $dI_\pi/dt$ of the reverse recovery current $I_\pi$ is the large (the so-called hard recovery). In order to suppress the surge voltage due to requirement in design of the circuit device, therefore, required is such a waveform that the absolute value of the time change rate $dI_\pi/dt$ of the reverse recovery current in the diode 100 is small (the so-called soft recovery).

In order to reduce steady loss, a forward voltage $V_F$ of the diode 100 must be low. In order to reduce switching loss, a reverse recovery charge $Q_\pi$ (corresponding to the area of the slanted portion in FIG. 26) which is calculated by time integration of the reverse recovery current $I_{90}$ must be small.

While various characteristics are required for the diode 100, the most required characteristic depends on the working condition on the circuit. When the circuit design has no allowance with respect to the surge voltage $V_{surge}$ with a large inductance L or the like, the soft recovery property is required for the diode 100, in order to suppress the surge voltage.

In order to totally reduce the reverse recovery current $I_\pi$ of the diode 100 (hence, the reverse recovery charge $Q_\pi$ is also reduced) to attain soft recovery, lifetimes of the N$^-$ layer 1 and the N$^+$ substrate 3 are uniformly reduced by diffusion of a heavy metal such as gold or platinum and application of a radiation such as an electron beam.

FIG. 27 is a model diagram of lifetime distributions of the N$^-$ layer 1 and the N$^+$ substrate 3 along the longitudinal sectional direction of the diode 100, showing the relation between longitudinal sectional depths x and lifetimes τ. In general, the lifetime is reduced in a region having a high impurity concentration, and hence the lifetime in the N$^+$ substrate 3 is smaller than that in the N$^-$ layer 1.

In the N$^-$ layer 1 having a uniform lifetime, however, the forward voltage $V_F$ is disadvantageously extremely increased although suppression of the lifetime is in the direction toward soft recovery.

The reverse recovery charge $Q_\pi$ of the diode 100 must certainly be reduced in order to reduce the switching loss. However, it is also necessary to suppress the steady loss by reducing the forward voltage $V_F$ of the diode 100 at the same time.

Particularly when a driving frequency is low, an influence exerted on total loss is extremely larger in the steady loss caused by the forward voltage $V_F$ rather than the switching loss caused by the reverse recovery charge $Q_\pi$. Therefore, the total loss is remarkably increased due to the aforementioned problem, which is further serious for a diode having a low driving frequency. Further, this is a significant problem in circuit design having no allowance with respect to loss or the like. In the case of employing a radiant beam such as an electron beam in order to suppress the lifetime, it is necessary to form a large amount of damage uniformly over the entire N$^-$ layer 1 as well as the P layer 2 and the N$^+$ substrate 3. Such a large amount of damage prevents the depletion layer in the N$^-$ layer 1 from spreading, and this results in the deterioration of the breakdown voltage.

SUMMARY OF THE INVENTION

According to a first aspect of the present invention, a semiconductor device comprises (a) a first conductivity type first semiconductor layer including first and second major surfaces and having a first impurity concentration, (b) a second conductivity type second semiconductor layer which is provided on the first major surface of the first semiconductor layer, (c) a first conductivity type third semiconductor layer which is provided on the second major surface of the first semiconductor layer and has a second impurity concentration higher than the first impurity concentration, (d) a first electrode layer which is in contact with the second semiconductor layer, and (e) a second electrode layer which is in contact with the third semiconductor layer, and the first semiconductor layer is provided with (a-1) a first region which is in contact with the second semiconductor layer and has a first lifetime, (a-2) a second region which is provided between the first region and the third semiconductor layer to be in contact with the first region and has a second lifetime smaller than the first lifetime, and (a-3) a third region which is provided between the second region and the third semiconductor layer and has a third lifetime larger than the first lifetime.

In the semiconductor device according to the first aspect of the present invention, there exist excess carriers which are stored during a forward operation in a region close to the boundary between the first and third semiconductor layers in case of switching the forward operation to an opposite operation. The lifetime of the excess carriers in the vicinity is set large. Therefore, the excess carriers slowly disappear after the reverse recovery current reaches its peak. Namely, the reverse recovery current is slowly reduced toward zero over a long time, whereby the absolute value of the time change rate thereof is reduced and a soft recovery waveform is attained. Therefore, a surge voltage which is generated in a circuit employing such a semiconductor device is suppressed.

The fact that the lifetime is large in the vicinity of the boundary between the first and third semiconductor layers brings increase of the reverse recovery current, i.e., increase of the reverse recovery charge. According to the present invention, however, the lifetime is set small in a region of the first semiconductor layer which is close to the second semiconductor layer, and such setting has an action of reducing the reverse recovery current and the reverse recovery charge. Thus, the degrees of such increase are suppressed.

The means of setting the lifetime small in the region of the first semiconductor layer which is close to the second semiconductor layer serves as a factor increasing the forward voltage, while the fact that the lifetime is large in the vicinity of the boundary between the first and third semiconductor layers has an action of reducing the forward voltage. Therefore, increase of the forward voltage is suppressed (corresponding to a first object).

When control of the lifetime is formed by introduction of damage of crystals (lattice defects), this damage serves as a cause for inhibiting spreading of a depletion layer in the first semiconductor layer. This brings reduction in withstand voltage. In order to avoid such a problem, it is necessary to reduce the damage density in the first semiconductor layer. Spreading of the depletion layer starts from a P-N junction part between the first and second semiconductor layers, whereby it is rather effective to reduce the damage density of a portion of the first semiconductor layer which is close to the second semiconductor layer.

Also when the damage density of the region of the first semiconductor layer which is close to the second semiconductor layer is set large in order to reduce the reverse recovery charge, therefore, the same is not uniformly set large. Reduction of the withstand voltage is suppressed by setting the damage density and the lifetime small and slightly large respectively in the portion close to the second semiconductor layer while setting the damage density and the lifetime large and small respectively in a portion close to the third semiconductor layer (corresponding to a third object).

In the semiconductor device according to the first aspect of the present invention, reduction of the surge voltage is attained without increasing the forward voltage (effect corresponding to the first object). When lifetime control is carried out by introduction of damage, reduction of the withstand voltage is suppressed (effect corresponding to the third object).

According to a second aspect of the present invention, a semiconductor device comprises (a) a first conductivity type first semiconductor layer including first and second major surfaces and having a first impurity concentration, (b) a second conductivity type second semiconductor layer which is provided on the first major surface of the first semiconductor layer, (c) a first conductivity type third semiconductor layer which is provided on the second major surface of the first semiconductor layer and has a second impurity concentration higher than the first impurity concentration, (d) a first electrode layer which is in contact with the second semiconductor layer, and (e) a second electrode layer which is in contact with the third semiconductor layer, and the first semiconductor layer is provided with (a-1) a first region which is in contact with the second semiconductor layer and has a first lifetime, and (a-2) a second region which is provided between the first region and the third semiconductor layer and has a second lifetime smaller than the first lifetime, while the third semiconductor layer is provided with (c-1) a third region which is in contact with the second electrode layer and has a third lifetime, and (c-2) a fourth region which is provided between the first semiconductor layer and the third region and has a fourth lifetime smaller than the third lifetime.

In the semiconductor device according to the second aspect of the present invention, the lifetimes are small in the second region of the first semiconductor layer and the fourth region of the third semiconductor layer. Therefore, the reverse recovery current is reduced and the reverse recovery charge is decreased. At this time, the fact that the lifetimes of the carriers in the second and fourth regions are small serves as a factor increasing the forward voltage, while the fact that the lifetimes of the first and third regions are large serves as a factor reducing the forward voltage, whereby increase of the forward voltage is suppressed. Thus, trade-off of the forward voltage and the reverse recovery charge is improved (corresponding to a second object).

When the lifetime of carriers in the first semiconductor layer is reduced by introduction of damage, reduction of the withstand voltage can be suppressed by reducing the damage density of the first region as compared with that of the second region, or by introducing no damage into the first region (corresponding to the third object).

According to a third aspect of the present invention, a semiconductor device comprises (a) a first conductivity type first semiconductor layer including first and second major surfaces and having a first impurity concentration, (b) a second conductivity type second semiconductor layer which is provided on the first major surface of the first semiconductor layer, (c) a first conductivity type third semiconductor layer which is provided on the second major surface of the first semiconductor layer and has a second impurity concentration higher than the first impurity concentration, (d) a first electrode layer which is in contact with the second semiconductor layer, and (e) a second electrode layer which is in contact with the third semiconductor layer, and the first semiconductor layer is provided with (a-1) a first region which is in contact with the second semiconductor layer and has a first lifetime, and (a-2) a second region which is provided between the first region and the third semiconductor layer and has a second lifetime smaller than the first lifetime.

In the semiconductor device according to the third aspect of the present invention, the lifetime of the carriers in the second region of the first semiconductor layer is small. Thus, the reverse recovery current is reduced and the reverse recovery charge is decreased. At this time, the fact that the lifetime of the carriers in the second region is small serves as a factor increasing the forward voltage, while the fact that the lifetime of the carriers in the first region is large serves as a factor reducing the forward voltage, whereby increase of the forward voltage is suppressed. Thus, trade-off of the forward voltage and the reverse recovery charge is improved (corresponding to the second object).

When the lifetime of carriers in the first semiconductor layer is reduced by introduction of damage, reduction of the withstand voltage can be suppressed by reducing the damage density of the first region as compared with that of the second region, or by introducing no damage into the first region (corresponding to the third object).

According to a fourth aspect of the present invention, a semiconductor device comprises (a) a first conductivity type first semiconductor layer including first and second major surfaces and having a first impurity concentration, (b) a second conductivity type second semiconductor layer which is provided on the first major surface of the first semiconductor layer, (c) a first conductivity type third semiconductor layer which is provided on the second major surface of the first semiconductor layer and has a second impurity concentration higher than the first impurity concentration, (d) a first electrode layer which is in contact with the second semiconductor layer, and (e) a second electrode layer which is in contact with the third semiconductor layer, and the third semiconductor layer is provided with (c-1) a first region which is in contact with the second electrode layer and has a first lifetime, and (c-2) a second region which is provided between the first semiconductor layer and the first region and has a second lifetime smaller than the first lifetime.

In the semiconductor device according to the fourth aspect of the present invention, the lifetime of the carriers in the second region of the third semiconductor layer is small. Thus, the reverse recovery current is reduced and the reverse recovery charge is decreased. At this time, the fact that the lifetime of the carriers in the second region is small serves as a factor increasing the forward voltage, while the fact that the lifetime of the carriers in the first region is large serves as a factor reducing the forward voltage, whereby increase of the forward voltage is suppressed. Thus, trade-off of the forward voltage and the reverse recovery charge is improved (corresponding to the second object). When the lifetime of carriers is reduced by introduction of damage, it is possible to reduce the damage density of the first semiconductor layer as compared with those of the first semiconductor layers of the semiconductor devices according to the first to third aspects of the present invention, or to introduce no damage into the first semiconductor layer. Therefore, reduction of the withstand voltage can be further suppressed (corresponding to the third object).

In each of the semiconductor devices according to the second to fourth aspects of the present invention, reduction of the forward voltage as well as that of the reverse recovery charge are attained (effect corresponding to the second object). When lifetime control is carried out by introduction of damage, further, reduction of the withstand voltage is suppressed (effect corresponding to the third object).

The method of fabricating a semiconductor device according to the present invention is adapted to attain a fourth object. While damage is caused in a semiconductor layer by application of a corpuscular beam, a peak value of the damage density is provided and the carrier lifetime is minimized in the vicinity of a stop position of the corpuscular beam. In a passage portion in front of the corpuscular beam stop position, the damage density is smaller than that in the vicinity of the stop position, whereby the carrier lifetime is larger than that in the vicinity of the stop position. In a portion following the corpuscular beam stop position, the carrier lifetime is maximized due to absolutely no action of the corpuscular beam and occurrence of no damage.

According to a fifth aspect of the present invention, a method of fabricating a semiconductor device comprises steps of (a) preparing a first conductivity type first semiconductor layer including first and second major surfaces and having a first impurity concentration, a second conductivity type second semiconductor layer on the first major surface of the first semiconductor layer, and a first conductivity type third semiconductor layer having a second impurity concentration which is higher than the first impurity concentration on the second major surface of the first semiconductor layer, (b) applying a first corpuscular beam at a first dose through the second semiconductor layer and stopping the first corpuscular beam in the first semiconductor layer, thereby dividing the first semiconductor layer into a first region having a first damage density, a second region having a second damage density which is larger than the first damage density, and a third region having no damage by said first corpuscular beam, (c) providing a first electrode layer on the second semiconductor layer, and (d) providing a second electrode layer on the third semiconductor layer.

Preferably, the step (c) is carried out in advance of the step (b).

Preferably, the step (d) is carried out in advance of the step (b).

Preferably, the step (c) is carried out following the step (b).

Preferably, the step (d) is carried out following the step (b).

According to a sixth aspect of the present invention, the method of fabricating a semiconductor device according to the fifth aspect further comprises (e) a step of applying a second corpuscular beam at a second dose which is smaller than the first dose through the third semiconductor layer to be stopped at a position which is substantially identical to that of the first corpuscular beam.

In the method of fabricating a semiconductor device according to the fifth and sixth aspects of the present invention, it is possible to fabricate the semiconductor device according to the first aspect. The first to third regions of the semiconductor device according to the first aspect are formed by applying the first corpuscular beam through the second semiconductor layer and stopping the same in the first semiconductor layer.

Particularly in the method of fabricating a semiconductor device according to the sixth aspect of the present invention, the second corpuscular beam is applied through the third semiconductor layer in addition to the steps of the method of fabricating a semiconductor device according to the fifth aspect, thereby making the third region have damage whose density is smaller than the first damage density and reducing the lifetime in the third region while maintaining the large-small relation between the lifetimes in the first to third regions.

In the method of fabricating a semiconductor device according to the fifth and sixth aspects of the present invention, it is possible to fabricate the semiconductor device according to the first aspect (effect corresponding to the fourth object).

Particularly in the method of fabricating a semiconductor device according to the sixth aspect, it is possible to obtain a semiconductor device in which the reverse recovery charge is further suppressed.

According to a seventh aspect of the present invention, a method of fabricating a semiconductor device comprises steps of (a) preparing a first conductivity type first semiconductor layer including first and second major surfaces and having a first impurity concentration, a second conductivity type second semiconductor layer on the first major surface of the first semiconductor layer, and a first conductivity type third semiconductor layer having a second impurity concentration which is higher than the first impurity concentration on the second major surface of the first semiconductor layer, (b) applying a corpuscular beam through the second semiconductor layer and stopping the corpuscular beam in the vicinity of the boundary between the first and third semiconductor layers, thereby (b-1) dividing the first semiconductor layer into a first region having a first damage density, and a second region having a second damage density which is larger than the first damage density, and (b-2) dividing the third semiconductor layer into a third region which is not damaged by the corpuscular beam, and a fourth region which is damaged by the corpuscular beam, (c) providing a first electrode layer on the second semiconductor layer, and (d) providing a second electrode layer on the third semiconductor layer.

Preferably, the step (c) is carried out in advance of the step (b).

Preferably, the step (d) is carried out in advance of the step (b).

Preferably, the step (c) is carried out following the step (b).

Preferably, the step (d) is carried out following the step (b).

According to an eighth aspect of the present invention, a method of fabricating a semiconductor device comprises steps of (a) preparing a first conductivity type first semiconductor layer including first and second major surfaces and having a first impurity concentration, a second conductivity type second semiconductor layer on the first major surface of the first semiconductor layer, and a first conductivity type third semiconductor layer having a second impurity concentration which is higher than the first impurity concentration on the second major surface of the first semiconductor layer, (b) applying a corpuscular beam through the third semiconductor layer and stopping the corpuscular beam in the vicinity of the boundary between the first and third semiconductor layers, thereby (b-1) dividing the first semiconductor layer into a first region which is not damaged by the corpuscular beam, and a second region which is damaged by the corpuscular beam, and (b-2) dividing the third semiconductor layer into a third region having a prescribed damage density, and a fourth region having an damage density which is larger than the prescribed damage density, (c) providing a first electrode layer on the second semiconductor layer, and (d) providing a second electrode layer on the third semiconductor layer.

Preferably, the step (c) is carried out in advance of the step (b).

Preferably, the step (d) is carried out in advance of the step (b).

Preferably, the step (c) is carried out following the step (b).

Preferably, the step (d) is carried out following the step (b).

In each of the methods of fabricating semiconductor devices according to the seventh and eighth aspects of the present invention, it is possible to fabricate the semiconductor device according to the second aspect. The first to fourth regions of the semiconductor device according to the second aspect are formed by applying the corpuscular beam and stopping the same in the vicinity of the boundary between the first and third semiconductor layers.

Particularly in the method of fabricating a semiconductor device according to the eighth aspect of the present invention, the first region which is not damaged by the corpuscular beam can be obtained by applying the corpuscular beam through the third semiconductor layer and stopping the same in the vicinity of the boundary between the first and third semiconductor layers.

In each of the methods of fabricating semiconductor devices according to the seventh and eighth aspects of the present invention, it is possible to fabricate the semiconductor device according to the second aspect (effect corresponding to the fourth object).

Particularly in the method of fabricating a semiconductor device according to the eighth aspect of the present invention, it is possible to obtain a semiconductor device in which reduction of the withstand voltage is further suppressed.

According to a ninth aspect of the present invention, a method of fabricating a semiconductor device comprises steps of (a) preparing a first conductivity type first semiconductor layer including first and second major surfaces and having a first impurity concentration, a second conductivity type second semiconductor layer on the first major surface of the first semiconductor layer, and a first conductivity type third semiconductor layer having a second impurity concentration which is higher than the first impurity concentration on the second major surface of the first semiconductor layer, (b) applying a corpuscular beam through the second semiconductor layer and stopping the corpuscular beam in the first semiconductor layer, thereby dividing the first semiconductor layer into a first region having a first damage density, and a second region having a second damage density which is larger than the first damage density, (c) providing a first electrode layer on the second semiconductor layer, and (d) providing a second electrode layer on the third semiconductor layer.

Preferably, the step (c) is carried out in advance of the step (b).

Preferably, the step (d) is carried out in advance of the step (b).

Preferably, the step (c) is carried out following the step (b).

Preferably, the step (d) is carried out following the step (b).

According to a tenth aspect of the present invention, a method of fabricating a semiconductor device comprises steps of (a) preparing a first conductivity type first semiconductor layer including first and second major surfaces and having a first impurity concentration, a second conductivity type second semiconductor layer on the first major surface of the first semiconductor layer, and a first conductivity type third semiconductor layer having a second impurity concentration which is higher than the first impurity concentration on the second major surface of the first semiconductor layer, (b) applying a corpuscular beam through the third semiconductor layer and stopping the corpuscular beam in the first semiconductor layer, thereby dividing the first semiconductor layer into a first region which is not damaged by the corpuscular beam, and a second region which is damaged by the corpuscular beam, (c) providing a first electrode layer on the second semiconductor layer, and (d) providing a second electrode layer on the third semiconductor layer.

Preferably, the step (c) is carried out in advance of the step (b).

Preferably, the step (d) is carried out in advance of the step (b).

Preferably, the step (c) is carried out following the step (b).

Preferably, the step (d) is carried out following the step (b).

In each of the methods of fabricating semiconductor devices according to the ninth and tenth aspects of the present invention, it is possible to fabricate the semiconductor device according to the third aspect. The first and second regions of the semiconductor device according to the third aspect are formed by applying the corpuscular beam and stopping the same in the first semiconductor layer.

Particularly in the method of fabricating a semiconductor device according to the tenth aspect of the present invention, the first region which is not damaged by the corpuscular beam can be obtained by applying the corpuscular beam through the third semiconductor layer and stopping the same in the first semiconductor layer.

In each of the methods of fabricating semiconductor devices according to the ninth and tenth aspects of the present invention, it is possible to fabricate the semiconductor device according to the third aspect (effect corresponding to the fourth object).

Particularly in the method of fabricating a semiconductor device according to the tenth aspect, it is possible to obtain a semiconductor device in which reduction of the withstand voltage is further suppressed.

According to an eleventh aspect of the present invention, a method of fabricating a semiconductor device comprises steps of (a) preparing a first conductivity type first semiconductor layer including first and second major surfaces and having a first impurity concentration, a second conductivity type second semiconductor layer on the first major surface of the first semiconductor layer, and a first conductivity type third semiconductor layer having a second impurity concentration which is higher than the first impurity concentration on the second major surface of the first semiconductor layer, (b) applying a corpuscular beam through the second semiconductor layer and stopping the corpuscular beam in the third semiconductor layer, thereby dividing the third semiconductor layer into a first region which is not damaged by the corpuscular beam, and a second region which is damaged by the corpuscular beam, (c) providing a first electrode layer on the second semiconductor layer, and (d) providing a second electrode layer on the third semiconductor layer.

Preferably, the step (c) is carried out in advance of the step (b).

Preferably, the step (d) is carried out in advance of the step (b).

Preferably, the step (c) is carried out following the step (b).

Preferably, the step (d) is carried out following the step (b).

According to a twelfth aspect of the present invention, a method of fabricating a semiconductor device comprises steps of (a) preparing a first conductivity type first semiconductor layer including first and second major surfaces and having a first impurity concentration, a second conductivity type second semiconductor layer on the first major surface of the first semiconductor layer, and a first conductivity type third semiconductor layer having a second impurity concentration which is higher than the first impurity concentration on the second major surface of the first semiconductor layer, (b) applying a corpuscular beam from the side of the third semiconductor layer and stopping the corpuscular beam in the third semiconductor layer, thereby dividing the third semiconductor layer into a first region having a first damage density, and a second region having a second damage density which is larger than the first damage density, (c) providing a first electrode layer on the second semiconductor layer, and (d) providing a second electrode layer on the third semiconductor layer.

Preferably, the step (c) is carried out in advance of the step (b).

Preferably, the step (d) is carried out in advance of the step (b).

Preferably, the step (c) is carried out following the step (b).

Preferably, the step (d) is carried out following the step (b).

Similarly to the conventional art, in order to reduce the reverse recovery charge, the damage is concentrated on the second region without increasing the overall damage density as well as the damage density in the first semiconductor layer. Therefore, the lifetime is reduced in the second region, and the reverse recovery charge is reduced as the result, while the spread of the depletion layer is not prevented in the first semiconductor layer. Accordingly, the deterioration of the breakdown voltage is suppressed (effect corresponding to the third object).

In each of the methods of fabricating semiconductor device according to the eleventh and twelfth aspects of the present invention, it is possible to fabricate the semiconductor device according to the fourth aspect. The first and second regions of the semiconductor device according to the fourth aspect are formed by applying the corpuscular beam and stopping the same in the third semiconductor layer.

Particularly in the method of fabricating a semiconductor device according to the twelfth aspect of the present invention, the first semiconductor layer is not damaged by the corpuscular beam by applying the corpuscular beam from the side of the third semiconductor layer and stopping the same in the third semiconductor layer.

In each of the methods of fabricating semiconductor device according to the eleventh and twelfth aspects of the present invention, it is possible to fabricate the semiconductor device according to the fourth aspect (effect corresponding to the fourth object).

Particularly in the method of fabricating a semiconductor device according to the twelfth aspect, it is possible to obtain a semiconductor device in which reduction of the withstand voltage is further suppressed.

According to a thirteenth aspect of the present invention, the method of fabricating a semiconductor device in accordance with any of the fifth to twelfth aspects further comprises a step of (x) applying a high energy corpuscular beam or a radiation for passing the corpuscular beam or the radiation through the first to third semiconductor layers.

Preferably, the step (x) is carried out in advance of the step (b).

Preferably, the step (x) is carried out following the step (b).

According to a fourteenth aspect of the present invention, the method of fabricating a semiconductor device in accordance with any of the fifth to twelfth aspects further comprises a step of (y) diffusing a heavy metal in the first to third semiconductor layers in advance of the step (b).

In the method of fabricating a semiconductor device according to the thirteenth or fourteenth aspect of the present invention, the step (x) or (y) is added to each of the methods of fabricating semiconductor devices according to the fifth to twelfth aspects of the present invention. Due to the added step (x) or (y), it is possible to form the first, second, third and fourth regions which are entirely superposed with uniform reduction of lifetimes.

In each of the methods of fabricating semiconductor device according to the thirteenth and fourteenth aspects of the present invention, it is possible to fabricate the semiconductor device according to the first to fourth aspects (effect corresponding to the fourth object).

In the method of fabricating a semiconductor device according to each of the thirteenth and fourteenth aspects of the present invention, it is possible to obtain a semiconductor device which can further suppress the reverse recovery charge with respect to the semiconductor device which is obtained by each of the methods of fabricating semiconductor devices according to the fifth to twelfth aspects.

Accordingly, the first object of the present invention is to provide a semiconductor device which can attain soft recovery without increasing a forward voltage by ununiformalizing lifetimes in a specific pattern, with a small surge voltage.

The second object of the present invention is to provide a semiconductor device having a small forward voltage and a small reverse recovery charge by improving trade-off of the forward voltage and the reverse recovery charge.

The third object of the present invention is to provide a semiconductor device having small withstand voltage reduction.

The fourth object of the present invention is to provide a method of fabricating a semiconductor device having these characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
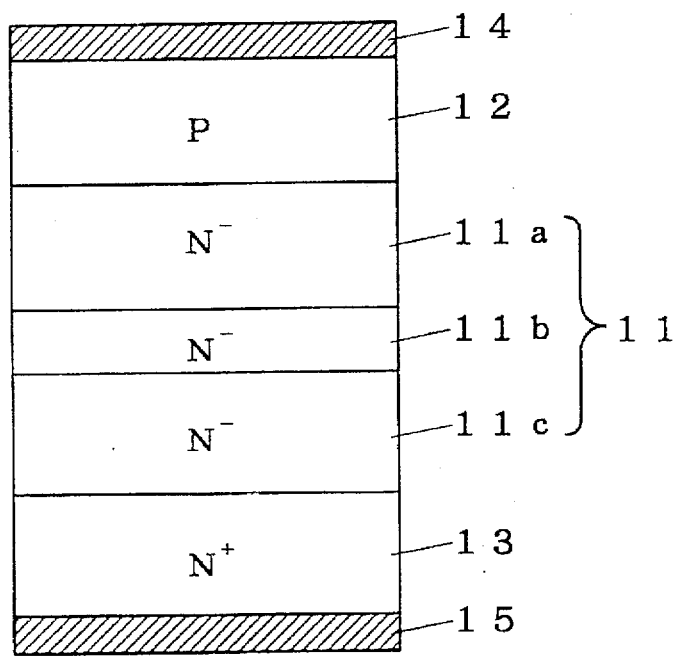
FIG. 1 is a sectional view showing the structure of a diode 10 according to a first embodiment of the present invention.

A. Embodiments of Semiconductor Devices:

(a-1) First Embodiment:

FIG. 1 is a sectional view showing the structure of a diode 10 according to a first embodiment of the present invention. In the diode 10, an $N^-$ layer 11 of a low impurity concentration is formed on an upper major surface of an $N^+$ layer 13 of a high impurity concentration. Further, a P layer 12 is formed on an upper major surface of the $N^-$ layer 11. An anode electrode 14 and a cathode electrode 15 are formed on an upper major surface of the P layer 12 and a lower major surface of the $N^+$ layer 13 respectively.

The thicknesses of the $N^-$ layer 11, the P layer 12 and the $N^+$ layer 13 may be set at arbitrarily values in response to a necessary withstand voltage, while the $N^-$ layer 11, the P layer 12 and the $N^+$ layer 13 have thicknesses of several μm to several 100 μm, several μm to several 10 μm, and several μm to several 100 μm respectively, for example.

Figure 2:
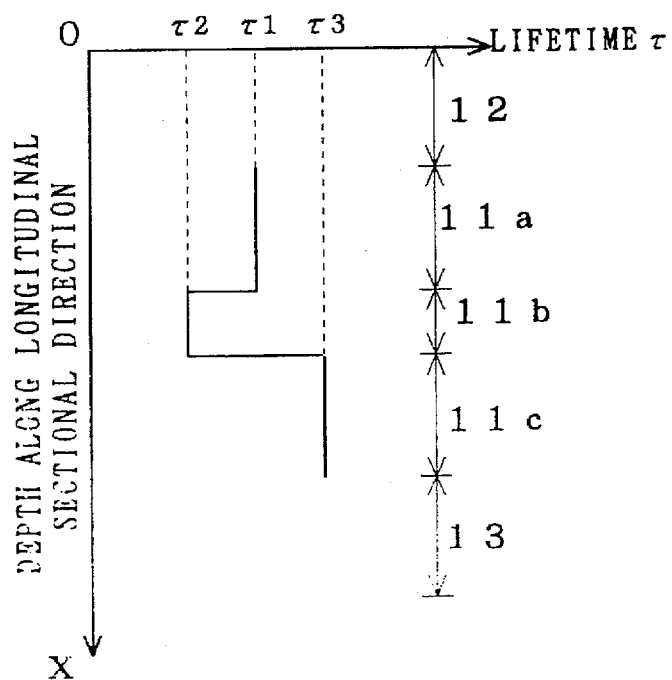
FIG. 2 is a model diagram showing a lifetime distribution of an $N^-$ layer 11 along the longitudinal sectional direction of the diode 10.

FIG. 2 is a model diagram showing a lifetime distribution of the $N^-$ layer 11 along the longitudinal sectional direction of the diode 10, illustrating the relation between depths x along the longitudinal sectional direction and lifetimes τ.

The $N^-$ layer 11 is in a multilayer structure of first to third regions 11a, 11b and 11c having carrier lifetimes $\tau_2$, $\tau_2$ and $\tau_3$ respectively. These lifetimes are in the relation of $\tau_2 < \tau_1 < \tau_3$. This structure can be obtained by applying a corpuscular beam of proton or the like from the side of the P layer 12 or further from the side of the $N^+$ layer 13 to be stopped in the $N^-$ layer 11 and introducing lattice defects, as clarified in later embodiments.

Since the large lifetime $\tau_3$ of the third region 11c is large, excess carriers which are stored in the third region 11c during a forward operation slowly disappear in a period after a reverse recovery current peak in a reverse recovery operation. Thus, the absolute value of a time change rate $dI_{rr}/dt$ of the reverse recovery current is reduced to implement soft recovery, whereby reduction of a surge voltage can be attained.

At this time, the fact that the lifetimes $\tau_1$ and $\tau_2$ of the first and second regions 11a and 11b are small serves as a factor increasing a forward voltage $V_F$. However, the fact that the lifetime $\tau_3$ of the third region 11c is large serves as a factor reducing the forward voltage $V_F$. Thus, it is possible to implement soft recovery without increasing the forward voltage $V_F$, by properly designing these lifetimes and the thicknesses.

The fact that the lifetime $\tau_3$ of the third region 11c is large serves as a factor increasing a reverse recovery current $I_\pi$ as well as a reverse recovery charge $Q_\pi$. However, the fact that the lifetimes $\tau_1$ and $\tau_2$ of the first and second regions 11a and 11b are small serves as a factor reducing the reverse recovery current $I_\pi$ as well as the reverse recovery charge $Q_\pi$, whereby the degree of increase of the reverse recovery charge $Q_\pi$ can be suppressed.

In employment for a low-frequency operation, further, steady loss caused by the forward voltage $V_F$ exerts extremely large influence on the total loss as compared with switching loss caused by the reverse recovery charge $Q_\pi$, as hereinabove described. Therefore, loss increase is suppressed as compared with the conventional diode 100 whose forward voltage $V_F$ is remarkably increased with implementation of soft recovery, to attain a remarkable effect particularly in case of designing a circuit having no allowance with respect to a surge voltage and loss and having a low driving frequency.

In the diode 10, further, suppression of the lifetime $\tau_1$ of the first region 11a is relieved as compared with that of the lifetime $\tau_2$ of the second region 11b. Namely, the lifetimes of these regions 11a and 11b are in the relation of $\tau_2 \leq \tau_1$. Thus, it is not necessary to increase the amount of lattice defect introduction (the damage density) of the first region 11a.

The first region 11a forms a P-N junction with the P layer 12, so that a depletion layer is spread from the P-N junction to support the withstand voltage when a reverse voltage is applied. Therefore, spreading of the depletion layer is inhibited when the damage density of the first region 11a is increased.

According to this embodiment, however, it is not necessary to increase the damage density of the first region 11a, as hereinabove described. Thus, it is possible to suppress withstand voltage reduction as compared with the conventional diode 100 in which the damage of a high density is uniformly formed over the entire $N^-$ layer 1 including the P layer 2 and the $N^+$ layer 3 by irradiating a large amount of a radiant beam such as an electron beam or the like. Further, the withstand voltage reduction is better suppressed in comparison with the structure having a two-layered $N^-$ layer 11 which is equivalent to the diode 10 wherein the damage density of the first region 11a is made as high as that of the second region 11b so that these two regions 11a and 11b form a single region, and the lifetime in this single region is suppressed better than that in the third region 11c. Furthermore, the withstand voltage reduction is better suppressed in comparison with the structure wherein the density of the damage formed by the corpuscular beam has its peak in the $N^-$ layer 11, and the hem of the peak covers the PN junction to make the damage density in the vicinity of the PN junction high.

Figure 3:
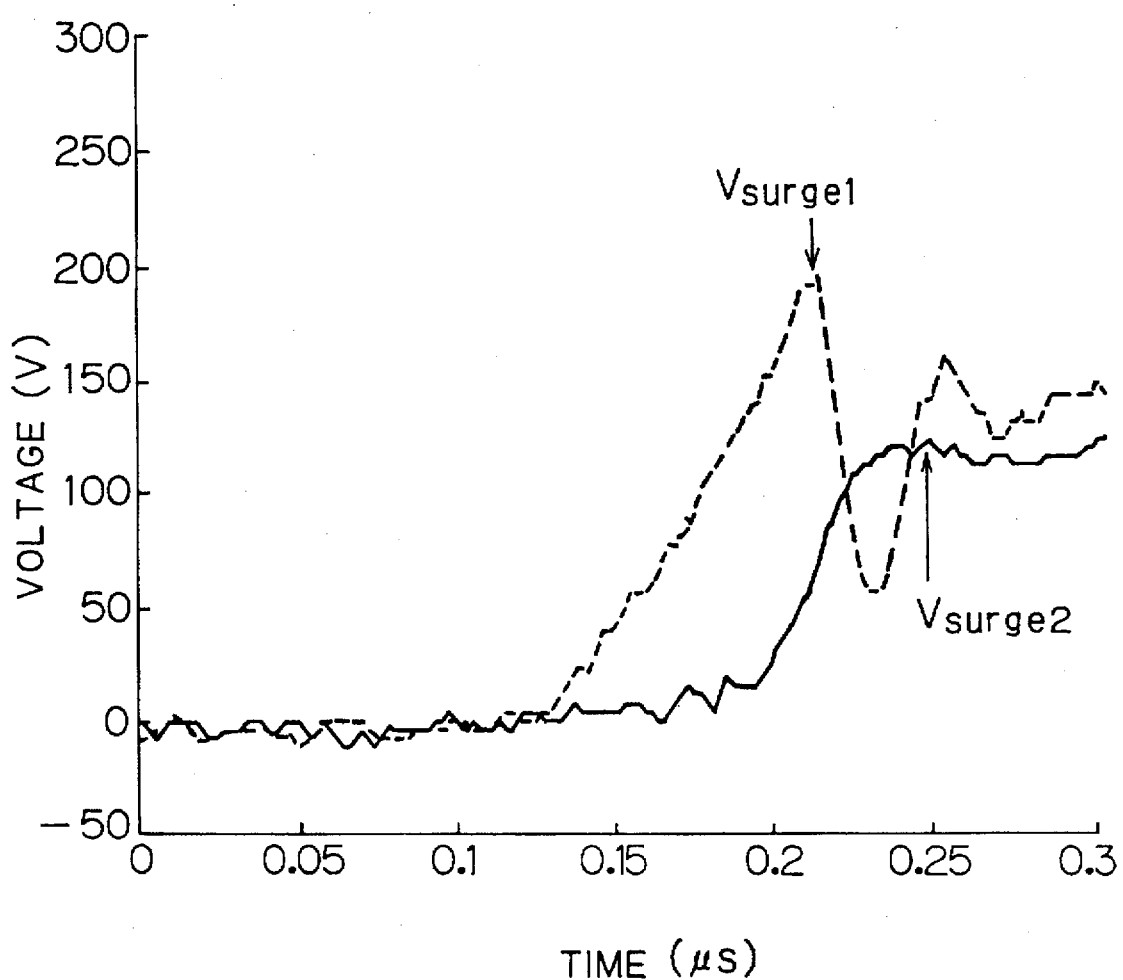
FIG. 3 is a graph showing a voltage waveform in a reverse recovery operation of the diode 10 compared with a diode 100 which is a conventional semiconductor device.

FIG. 3 is a graph illustrating an effect of this embodiment. This graph shows voltage waveforms in reverse recovery operations. The broken line shows a voltage waveform of the conventional diode 100 uniformalizing the lifetime of the $N^-$ layer 1 by the conventional technique, i.e., by carrying out heavy metal diffusion, while the solid line shows a voltage waveform of the diode 10 according to this embodiment applying proton into the $N^-$ layer 11 through the P layer 12. In either case, the forward voltage $V_F$ is 1.2 V (@300 A/cm²) in common.

As understood from FIG. 3 that the peak $V_{surge2}$ (surge voltage) of the voltage waveform is reduced by about 35% as compared with that $V_{surge1}$ of the voltage waveform, and hence it is understood possible to reduce the surge voltage without increasing the forward voltage $V_F$.

Figure 4:
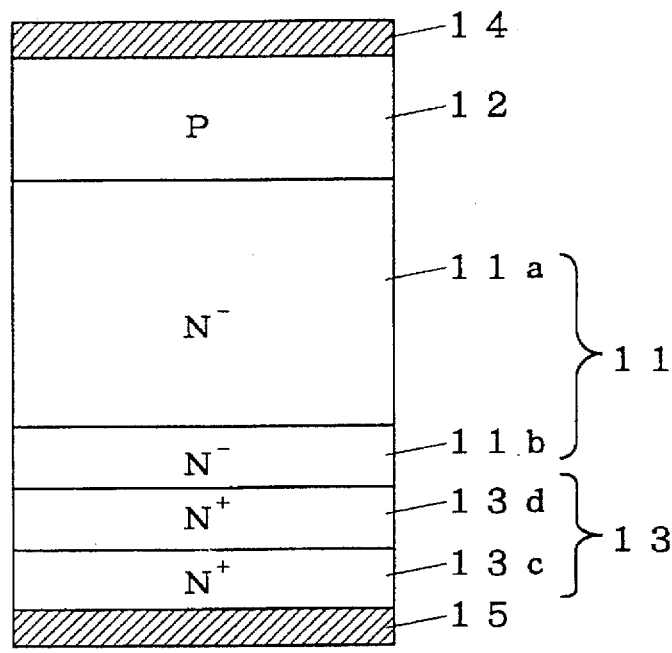
FIG. 4 is a sectional view showing the structure of a diode 20 according to a second embodiment of the present invention.

(a-2) Second Embodiment:

FIG. 4 is a sectional view showing the structure of a diode 20 according to a second embodiment of the present invention. In this diode 20, an $N^-$ layer 11 of a low impurity concentration is formed on an upper major surface of an $N^+$ layer 13 of a high impurity concentration. Further, a P layer 12 is formed on an upper major surface of the $N^-$ layer 11. An anode electrode 14 and a cathode electrode 15 are formed on an upper major surface of the P layer 12 and a lower major surface of the $N^+$ layer 13 respectively.

Figure 5:
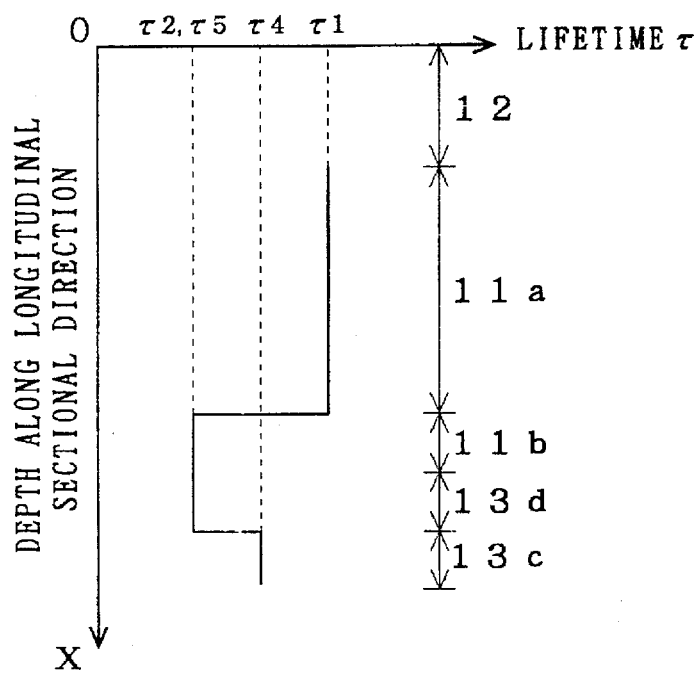
FIG. 5 is a model diagram showing lifetime distributions of an $N^-$ layer 11 and an $N^+$ layer 13 along the longitudinal sectional direction of the diode 20.

FIG. 5 is a model diagram showing lifetime distributions of the $N^-$ layer 11 and the $N^+$ layer 13 along the longitudinal sectional direction of the diode 20, illustrating the relation between depths x along the longitudinal direction and lifetimes $\tau$.

The $N^-$ layer 11 is in a multilayer structure of first and second regions 11a and 11b having lifetimes $\tau_1$ and $\tau_2$ respectively. On the other hand, the $N^+$ layer 13 is in a multilayer structure of third and fourth regions 13c and 13d having lifetimes $\tau_4$ and $\tau_5$ respectively. These lifetimes are in the relation of $\tau_2 < \tau_1$ and in the relation of $\tau_5 < \tau_4$ respectively.

This structure can be obtained by applying a corpuscular beam of proton or the like from the side of the P layer 12 or the side of the $N^+$ layer 13 to be stopped in the vicinity of the boundary between the $N^-$ layer 11 and the $N^+$ layer 13 and introducing lattice defects, as clarified in later embodiments.

Since the lifetimes $\tau_2$ and $\tau_5$ of the second and fourth regions 11b and 13d are small, a reverse recovery current $I_{96}$ as well as a reverse recovery charge $Q_{96}$ are reduced.

The fact that the lifetimes $\tau_2$ and $\tau_5$ of the second and fourth regions 11b and 13d are small serves as a factor increasing a forward voltage $V_F$. However, the fact that the lifetimes $\tau_1$ and $\tau_4$ of the first and third regions 11a and 13c are large serves as a factor reducing the forward voltage $V_F$, whereby the degree of increasing the forward voltage $V_F$ can be suppressed. Thus, trade-off of the forward voltage $V_F$ and the reverse recovery charge $Q_\pi$ is improved, to implement suppression of both of these values.

The fact that the lifetimes $\tau_2$ and $\tau_5$ of the second and fourth regions 11b and 13d are small serves as a factor for a tendency of hard recovery due to quick disappearance of excess carriers, which have been stored in these regions in a forward operation, in a period after a reverse recovery current peak. However, the forward voltage $V_F$ can be suppressed with the reverse recovery charge $Q_\pi$, whereby total loss can be reduced. Therefore, a particularly remarkable effect can be attained in case of designing a circuit having no allowance with respect to loss despite allowance with respect to a surge voltage.

Further, it is possible to reduce the damage density of the first region 11a or not to introduce the damage into the first region 11a, since the lifetime relation of $\tau_2 \geq \tau_1$ is set similarly to the first embodiment. Therefore, it is possible to suppress inhibition of spreading of a depletion layer in the first region 11a or not to inhibit spreading of a depletion layer in the first region 11a. Thus, it is possible to suppress withstand voltage reduction as compared with the conventional diode 100 in which the damage of a high density is uniformly formed over the entire $N^-$ layer 1 including the P layer 2 and the N⁺ layer 3 by irradiating a large amount of a radiant beam such as an electron beam or the like. Further, the withstand voltage reduction is better suppressed in comparison with the structure which is equivalent to the diode 20 wherein the damage density of the first region 11a is made higher than that of the second region 11b, and the lifetime $\tau_1$ of the first region 11a is set smaller than the lifetime $\tau_2$ of the second region 11b. Furthermore, the withstand voltage reduction is better suppressed in comparison with the structure wherein the density of the damage formed by the corpuscular beam has its peak in the N⁻ layer 11, and the hem of the peak covers the PN junction to make the damage density in the vicinity of the PN junction high.

Figure 6:
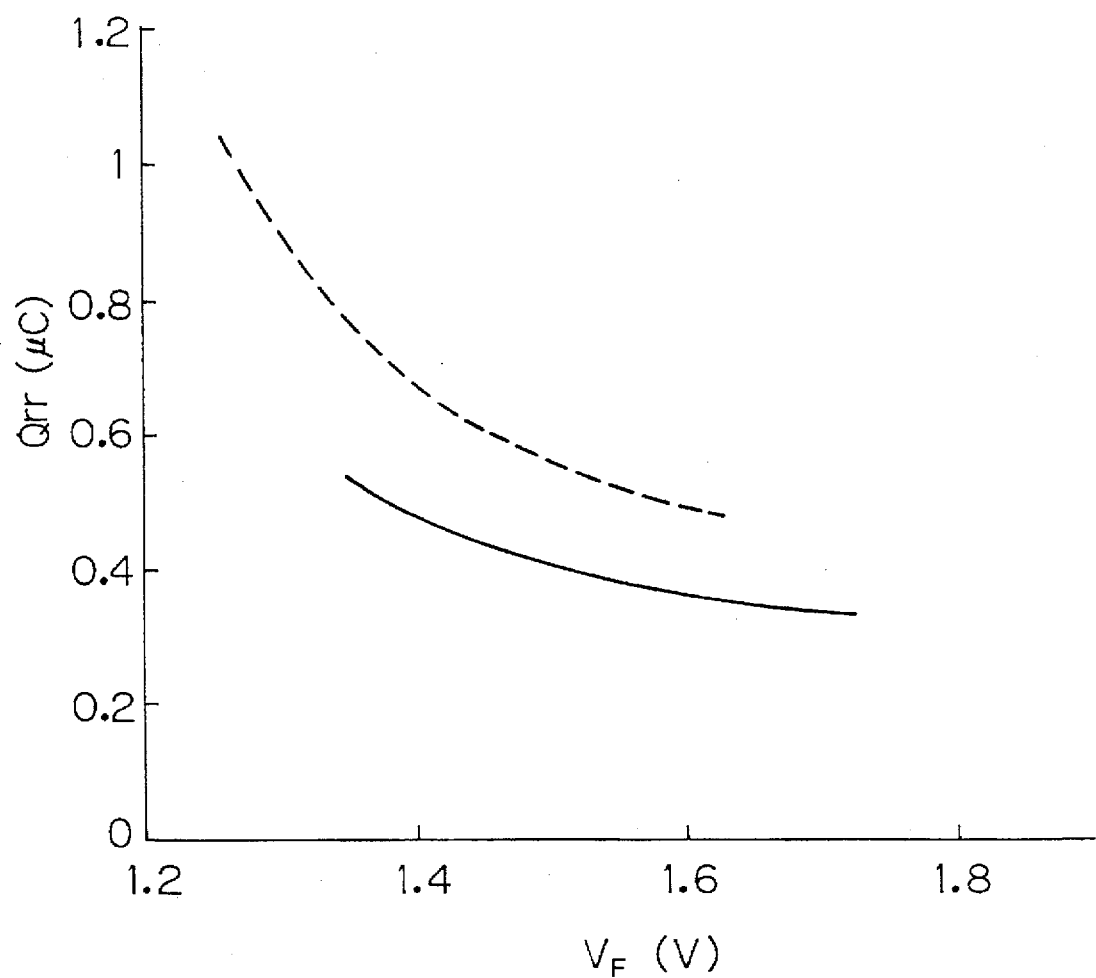
FIG. 6 is a graph showing the relation between forward voltages and reverse recovery charges of the diode 20 compared with a diode 100 which is a conventional semiconductor device.

FIG. 6 is a graph illustrating an effect of this embodiment. This graph shows the relation between the forward voltages $V_F$ and the reverse recovery charges $Q_\pi$. The broken line shows the case of the conventional diode 100 uniformalizing the lifetime of the N⁻ layer 1 by the conventional technique, i.e., by carrying out heavy metal diffusion, while the solid line shows the case of the diode 20 according to this embodiment applying proton to be stopped in the vicinity of the boundary between the N⁻ layer 11 and the N⁺ layer 13 through the P layer 12, respectively. The thicknesses and impurity concentrations of the diodes 100 and 20 are common to each other.

As understood from this graph, the trade-off of the forward voltage $V_F$ and the reverse recovery charge $Q_\pi$ in the diode 20 according to this embodiment is improved as compared with the conventional diode 100. Namely, it is possible to reduce the forward voltage $V_\nu$ and the reverse recovery charge $Q_\pi$.

While the lifetimes $\tau_2$ and $\tau_5$ of the second and fourth regions 11b and 13d are equal to each other in this embodiment as shown in FIG. 5, the effect of this embodiment can be attained regardless of the relation between these lifetimes $\tau_2$ and $\tau_5$, as understood from the above description.

Figure 7:
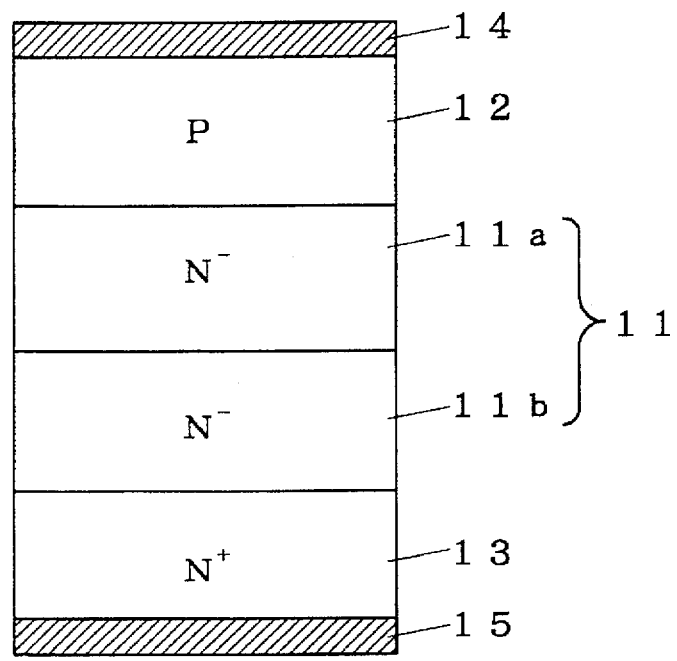
FIG. 7 is a sectional view showing the structure of a diode 30 according to a third embodiment of the present invention.

(a-3) Third Embodiment:

FIG. 7 is a sectional view showing the structure of a diode 30 according to a third embodiment of the present invention. In the diode 30, an N⁻ layer 11 of a low impurity concentration is formed on an upper major surface of an N⁺ layer 13 of a high impurity concentration. Further, a P layer 12 is formed on an upper major surface of the N⁻ layer 11. An anode electrode 14 and a cathode electrode 15 are formed on an upper major surface of the P layer 12 and a lower major surface of the N⁺ layer 13 respectively.

Figure 8:
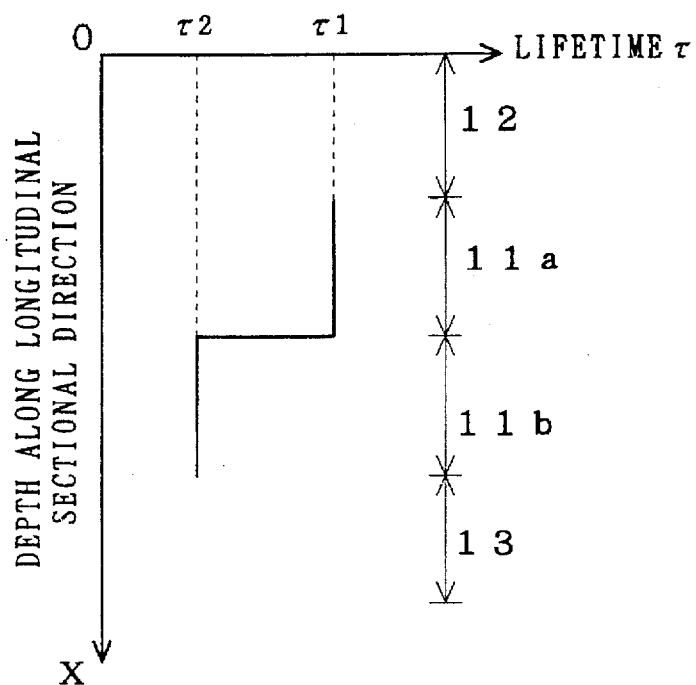
FIG. 8 is a model diagram showing a lifetime distribution of an $N^-$ layer 11 along the longitudinal sectional direction of the diode 30.

FIG. 8 is a model diagram showing a lifetime distribution of the N⁻ layer 11 along the longitudinal sectional direction of the diode 30, illustrating the relation between depths x along the longitudinal sectional direction and lifetimes $\tau$.

The N⁻ layer 11 is in a multilayer structure of first and second regions 11a and 11b having lifetimes $\tau_1$ and $\tau_2$ respectively. These lifetimes are in the relation of $\tau_2 < \tau_1$.

This structure can be obtained by applying a corpuscular beam of proton or the like from the side of the P layer 12 or the side of the N⁺ layer 13 to be stopped in a portion of the N⁻ layer 11 which is close to the N⁺ layer 13 and introducing lattice defects, as clarified in later embodiments.

Due to the small lifetime $\tau_2$ of the second region 11b, a reverse recovery current $I_\pi$ as well as a reverse recovery charge $Q_\pi$ are reduced. The fact that the lifetime $\tau_2$ of the second region 11b is small serves as a factor increasing the forward voltage $V_F$. However, the fact that the lifetime $\tau_1$ of the first region 11a is large serves as a factor reducing the forward voltage $V_F$, whereby the trade-off of the forward voltage $V_F$ and the reverse recovery charge $Q_\pi$ is improved.

Thus, reduction of both of the forward voltage $V_F$ and the reverse recovery charge $Q_\pi$ is attained.

The fact that the lifetime $\tau_2$ of the second region 11b is small serves as a factor for a tendency of hard recovery due to quick disappearance of excess carriers in a period after a reverse recovery current peak and a tendency of increasing a surge voltage, similarly to the second embodiment. However, the forward voltage $V_F$ can be suppressed with the reverse recovery charge $Q_\pi$, whereby total loss can be reduced. Therefore, a particularly remarkable effect can be attained in case of designing a circuit having no allowance with respect to loss despite allowance with respect to the surge voltage, similarly to the second embodiment. Further, similarly to the first preferred embodiment, the lifetime $\tau_1$ of the first region 11a is set larger than the lifetime $\tau_2$ of the second region 11b. Therefore, it is possible to form no damage or to make the damage density small in the region 11a. Accordingly, it is possible to provide no prevention or to suppress the prevention of the spread of the depletion layer in the first region 11a. Thus, it is possible to suppress withstand voltage reduction as compared with the conventional diode 100 in which the damage of a high density is uniformly formed over the entire N⁻ layer 1 including the P layer 2 and the N⁺ layer 3 by irradiating a large amount of a radiant beam such as an electron beam or the like. Further, the withstand voltage reduction is better suppressed in comparison with the structure which is equivalent to the diode 30 wherein the damage density of the first region 11a is made higher than that of the second region 11b, and the lifetime $\tau_1$ of the first region 11a is set smaller than the lifetime $\tau_2$ of the second region 11b. Furthermore, the withstand voltage reduction is better suppressed in comparison with the structure wherein the density of the damage formed by the corpuscular beam has its peak in the N⁻ layer 11, and the hem of the peak covers the PN junction to make the damage density in the vicinity of the PN junction high.

Figure 9:
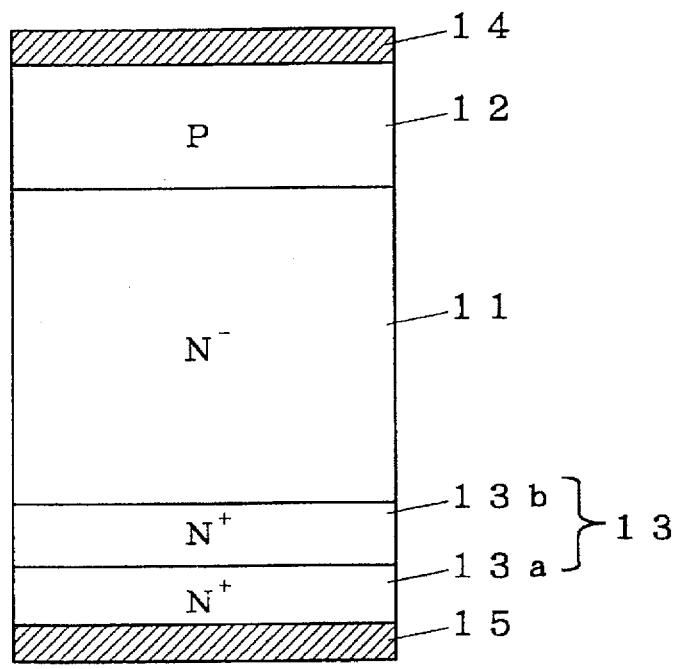
FIG. 9 is a sectional view showing the structure of a diode 40 according to a fourth embodiment of the present invention.

(a-4) Fourth Embodiment:

FIG. 9 is a sectional view showing the structure of a diode 40 according to a fourth embodiment of the present invention. In the diode 40, an N⁻ layer 11 of a low impurity concentration is formed on an upper major surface of an N⁺ layer 13 of a high impurity concentration. Further, a P layer 12 is formed on an upper major surface of the N⁻ layer 11. An anode electrode 14 and a cathode electrode 15 are formed on an upper major surface of the P layer 12 and a lower major surface of the N⁺ layer 13 respectively.

Figure 10:
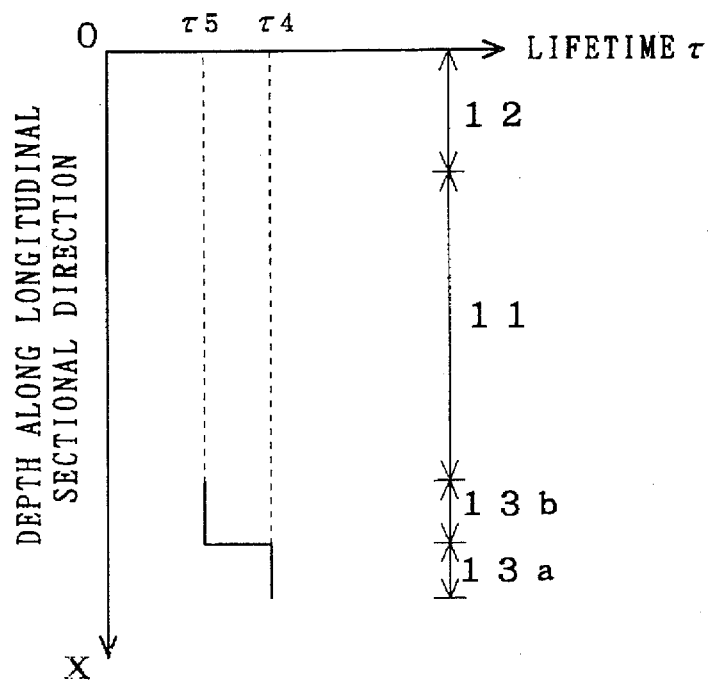
FIG. 10 is a model diagram showing a lifetime distribution of an $N^+$ layer 13 along the longitudinal sectional direction of the diode 40.

FIG. 10 is a model diagram showing a lifetime distribution of the N⁺ layer 13 along the longitudinal sectional direction of the diode 40, illustrating the relation between depths x along the longitudinal sectional direction and lifetimes $\tau$.

The N⁺ layer 13 is in a multilayer structure of first and second regions 13a and 13b having lifetimes $\tau_4$ and $\tau_5$ respectively. These lifetimes are in the relation of $\tau_4 > \tau_5$.

This structure can be obtained by applying a corpuscular beam of proton or the like from the side of the P layer 12 or the side of the N⁺ layer 13 to be stopped in a portion of the N⁺ layer 13 which is close to the N⁻ layer 11 and introducing lattice defects, as clarified in later embodiments.

Due to the small lifetime $\tau_5$ of the second region 13b, a reverse recovery current $I_\pi$, as well as a reverse recovery charge $Q_\pi$ are reduced. The fact that the lifetime $\tau_5$ of the second region 13b is small serves as a factor increasing the forward voltage $V_F$. However, the fact that the lifetime $\tau_4$ of the first region 13a is large serves as a factor reducing the forward voltage $V_F$, whereby the trade-off of the forward voltage $V_F$ and the reverse recovery charge $Q_{rr}$ is improved. Thus, reduction of both of the forward voltage $V_F$ and the reverse recovery charge $Q_{rr}$ is attained.

The fact that the lifetime $\tau_S$ of the second region 13b is small serves as a factor for a tendency of hard recovery due to quick disappearance of excess carriers in a period after a reverse recovery current peak and a tendency of increasing a surge voltage, similarly to the second embodiment. However, the forward voltage $V_F$ can be suppressed with the reverse recovery charge $Q_{rr}$, whereby total loss can be reduced. Therefore, a particularly remarkable effect can be attained in case of designing a circuit having no allowance with respect to loss despite allowance with respect to the surge voltage, similarly to the second embodiment.

Particularly in this embodiments, lattice defects are mainly distributed about the second region 13b in the N+ layer 13. Therefore, the damage density of the N− layer 11 is small as compared with those of the first to third embodiments, or the damage of the N− layer 11 doesn't exist. Thus, the degree of inhibiting spreading of a depletion layer in the N− layer 11 is small or spreading of a depletion layer in the N− layer 11 isn't inhibited, whereby withstand voltage reduction is further suppressed.

B. Embodiments of a Method of Fabricating a Semiconductor Device:

(b-1) Fifth Embodiment:

FIGS. 11 to 14 are sectional views showing a fifth embodiment of the present invention in order of steps. The fifth embodiment presents a method of fabricating the diode 10 shown in the first embodiment.

Figure 11:
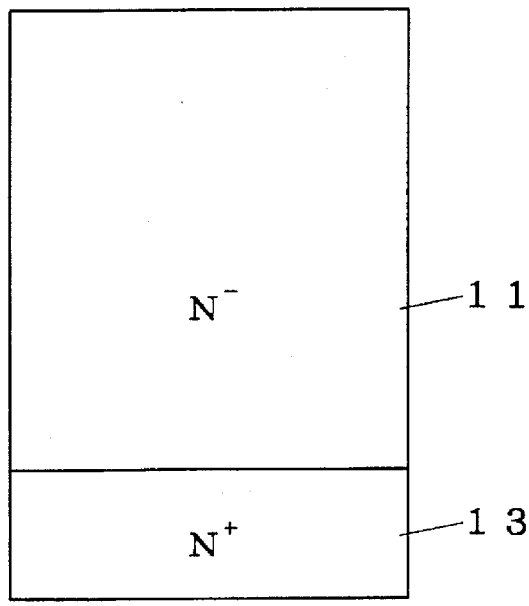
FIGS. 11 to 14 are sectional views showing a step in a method of fabricating a semiconductor device according to a fifth embodiment of the present invention.
Figure 12:
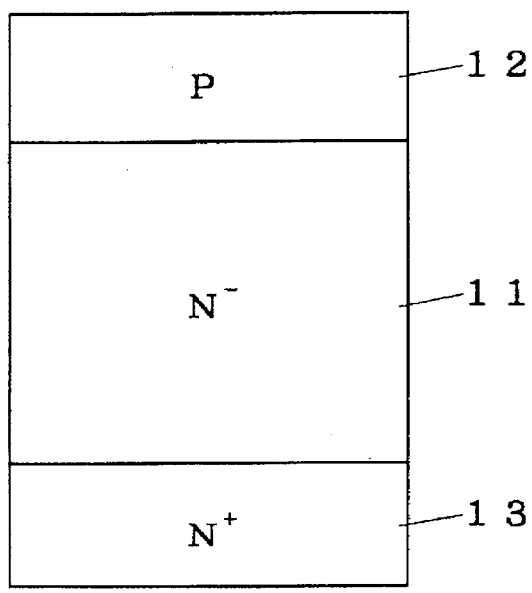
Figure 13:
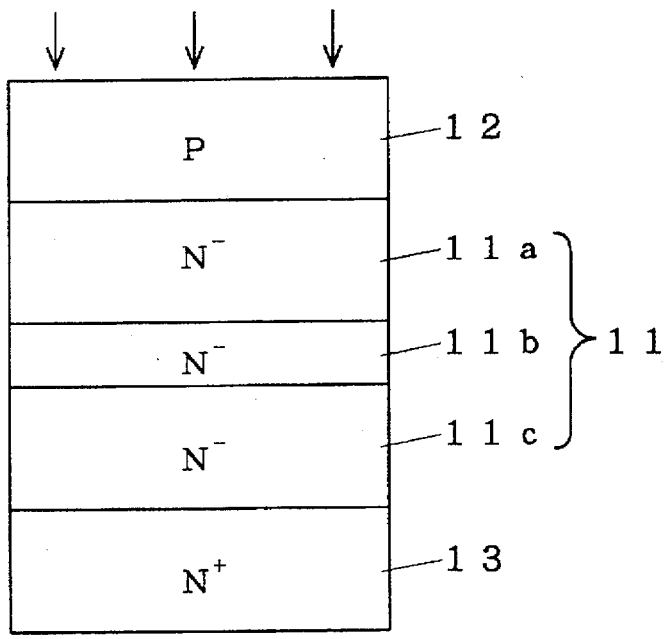

First, an N+ layer 13 is prepared, and an N− layer 11 is formed on its upper major surface by epitaxial growth, as shown in FIG. 11. Then, a P-type impurity is introduced into an upper major surface of the N− layer 11 by ion implantation or diffusion, to form a P layer 12 as shown in FIG. 12. Thereafter a corpuscular beam of proton, helium, deuterium or the like is applied from an upper major surface side of the P layer 12 through this P layer 12, to be stopped in the N− layer 11 (FIG. 13, arrows A1). The N− layer 11 is damaged by this application, so that lattice defects are locally formed.

Due to such introduction of the lattice defects, the N− layer 11 is brought into a multilayer structure of a first region 11a corresponding to a passage portion of the corpuscular beam and having a relatively small damage density, a second region 11b corresponding to a portion close to a stop position of the corpuscular beam and existing in the vicinity of a peak position of the damage density, and a third region 11c corresponding to a portion not irradiated with the corpuscular beam and having no damage. The degree of the damage density influences on the lifetime, whereby local lifetime control is performed.

Figure 14:
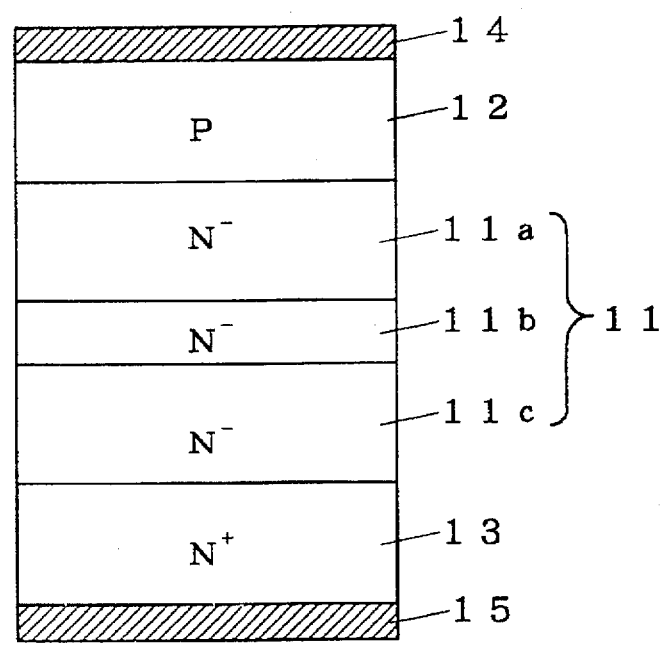

Further, an anode electrode 14 is formed on the upper major surface of the P layer 12, while a cathode electrode 15 is formed on a lower major surface of the N+ layer 13 (FIG. 14). Since the corpuscular beam passes through these electrodes, the same may alternatively be applied after formation of the anode and cathode electrodes 14 and 15.

The diode 10 shown in the first embodiment can be formed in the aforementioned manner.

(b-2) Sixth Embodiment:

A sixth embodiment of the present invention also provides a method of fabricating the diode 10 shown in the first embodiment.

Figure 15:
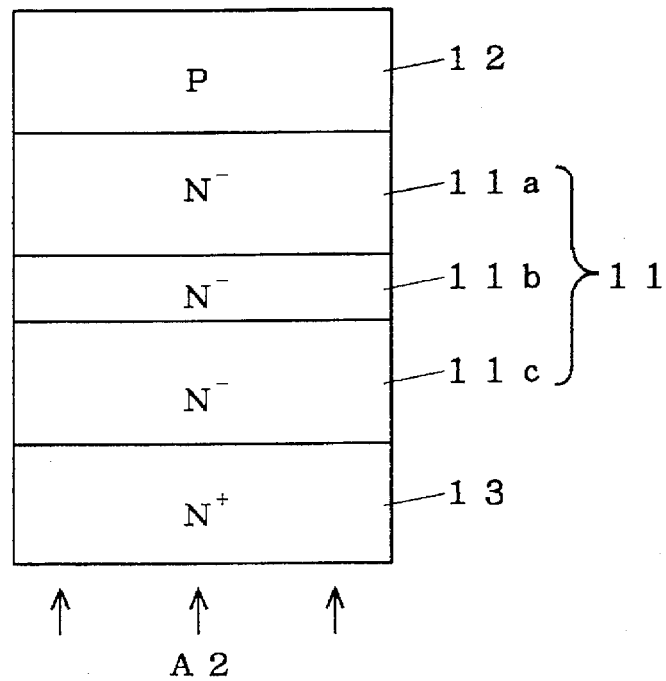
FIG. 15 is a sectional view showing a step in a method of fabricating a semiconductor device according to a sixth embodiment of the present invention.

First, the steps shown in FIGS. 11 to 13 are carried out similarly to the fifth embodiment. Then, a corpuscular beam of proton, helium, deuterium or the like is applied from a lower major surface side of an N+ layer 13 through this N+ layer 13 (FIG. 15, arrows A2). At this time, the corpuscular beam is applied to be stopped in a stop position which is substantially coincident with that of the corpuscular beam applied along arrows A1 in FIG. 13. The dose thereof is smaller than that in the application along arrow A1.

Thus, an N− layer 11 is brought into a multilayer structure of a first region 11a corresponding to a passage portion of the corpuscular beam shown by arrows A1, a third region 11c corresponding to a passage portion of the corpuscular beam shown by arrows A2 and having a smaller damage density than the first region 11a due to the smaller dose, and a second region 11b corresponding to a portion close to the stop positions of the bidirectional corpuscular beams along arrows A1 and A2, in which peaks of the damage density are superposed.

Thereafter an anode electrode 14 is formed on an upper major surface of a P layer 12, while a cathode electrode 15 is formed on the lower major surface of the N+ layer 13, as shown in FIG. 14.

Thus, the lifetime in the third region 11c is reduced while maintaining the large-small relation between the lifetimes of the first to third regions 11a to 11c, whereby a reverse recovery charge $Q_{rr}$ can be further reduced.

Also when the time relation between the application along arrows A2 and that along arrows A1 is reversed, a similar structure is attained, as a matter of course. Further, the corpuscular beam may alternatively be applied after formation of the anode and cathode electrodes 14 and 15, as described with reference to the fifth embodiment.

(b-3) Seventh Embodiment:

A seventh embodiment presents a method of fabricating the diode 20 shown in the second embodiment.

Figure 16:
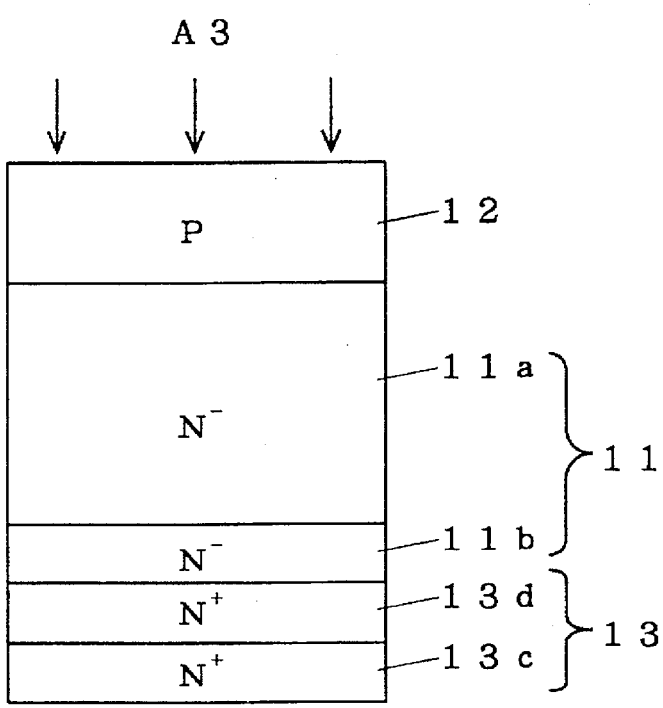
FIGS. 16 and 17 are sectional views showing a step in a method of fabricating a semiconductor device according to a seventh embodiment of the present invention.

First, the steps shown in FIGS. 11 and 12 are carried out similarly to the fifth embodiment. Then, a corpuscular beam of proton, helium, deuterium or the like is applied from an upper major surface side of a P layer 12 through this P layer 12, to be stopped in the vicinity of the boundary between an N− layer 11 and an N+ layer 13 (FIG. 16, arrows A3).

Thus, the N− layer 11 is brought into a multilayer structure of a first region 11a corresponding to a passage portion of the corpuscular beam and having a relatively small damage density, and a second region 11b corresponding to a portion close to a stop position of the corpuscular beam, i.e., in the vicinity of a peak position of the damage density. On the other hand, the N+ layer 13 is brought into a multilayer structure of a third region 13c corresponding to a portion not irradiated with the corpuscular beam with no damage by the corpuscular beam, and a fourth region 13d corresponding to a portion close to the stop position of the corpuscular beam, i.e., in the vicinity of the peak position of the damage density.

Figure 17:
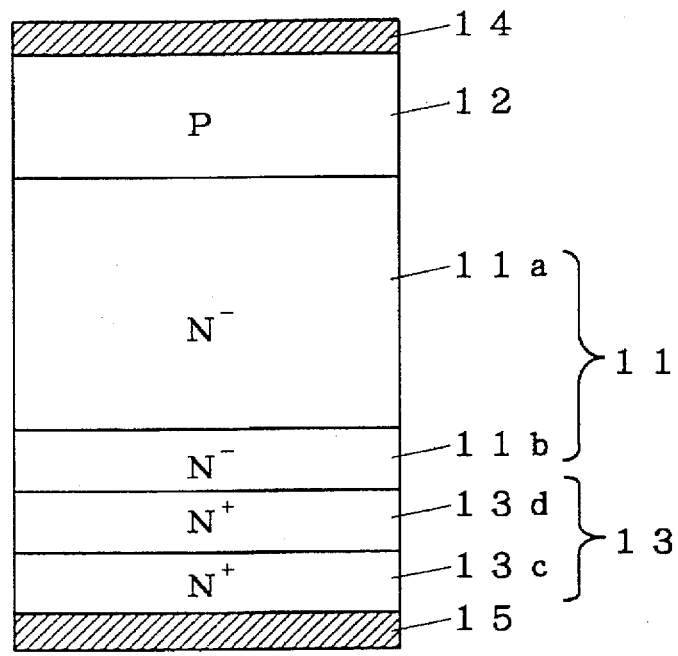

Thereafter an anode electrode 14 is formed on the upper major surface of the P layer 12, while a cathode electrode 15 is formed on a lower major surface of the N+ layer 13, as shown in FIG. 17. The corpuscular beam may alternatively be applied after formation of the anode and cathode electrodes 14 and 15, as described with reference to the fifth embodiment.

The diode 20 shown in the second embodiment can be formed in the aforementioned manner.

(b-4) Eighth Embodiment:

An eighth embodiment also presents a method of fabricating the diode 20 shown in the second embodiment.

Figure 18:
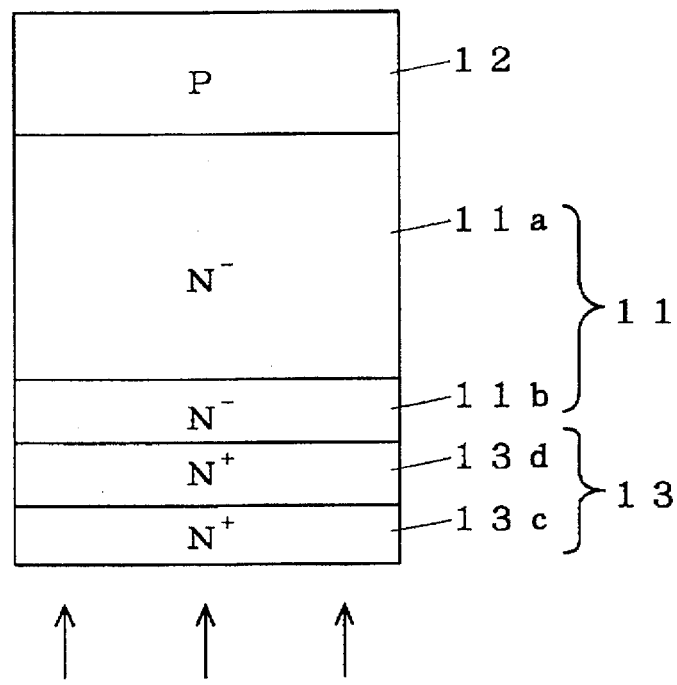
FIG. 18 is a sectional view showing a step in a method of fabricating a semiconductor device according to an eighth embodiment of the present invention.

First, the steps shown in FIGS. 11 and 12 are carried out similarly to the fifth embodiment. Then, a corpuscular beam of proton, helium, deuterium or the like is applied from a lower major surface side of an $N^+$ layer 13 through this $N^{30}$ layer 13, to be stopped in the vicinity of the boundary between an $N^-$ layer 11 and the $N^{30}$ layer 13 (FIG. 18, arrows A4).

Thus, the $N^-$ layer 11 is brought into a multilayer structure of a first region 11a corresponding to a portion not irradiated with the corpuscular beam with no damage by the corpuscular beam, and a second region 11b corresponding to a portion close to a stop position of the corpuscular beam, i.e., in the vicinity of a peak position of the damage density. On the other hand, the $N^+$ layer 13 is brought into a multilayer structure of a third region 13c corresponding to a passage portion of the corpuscular beam and having a relatively small damage density, and a fourth region 13d corresponding to a portion close to the stop position of the corpuscular beam, i.e., in the vicinity of the peak position of the damage density.

Thereafter an anode electrode 14 is formed on an upper major surface of a P layer 12, while a cathode electrode 15 is formed on a lower major surface of the $N^+$ layer 13, as shown in FIG. 17. The corpuscular beam may alternatively be applied after formation of the anode and cathode electrodes 14 and 15, as described with reference to the fifth embodiment.

The diode 20 shown in the second embodiment can be formed in the aforementioned manner.

Particularly when the diode 20 is formed by the method shown in the eighth embodiment, spreading of a depletion layer is not inhibited in the first region 11a since the first region 11a is not damaged by the corpuscular beam. Therefore, withstand voltage reduction of the diode 20 can be suppressed as compared with the case of forming the diode 20 through the method shown in the seventh embodiment.

(b-5) Ninth Embodiment:

A ninth embodiment presents a method of fabricating the diode 30 shown in the third embodiment.

Figure 19:
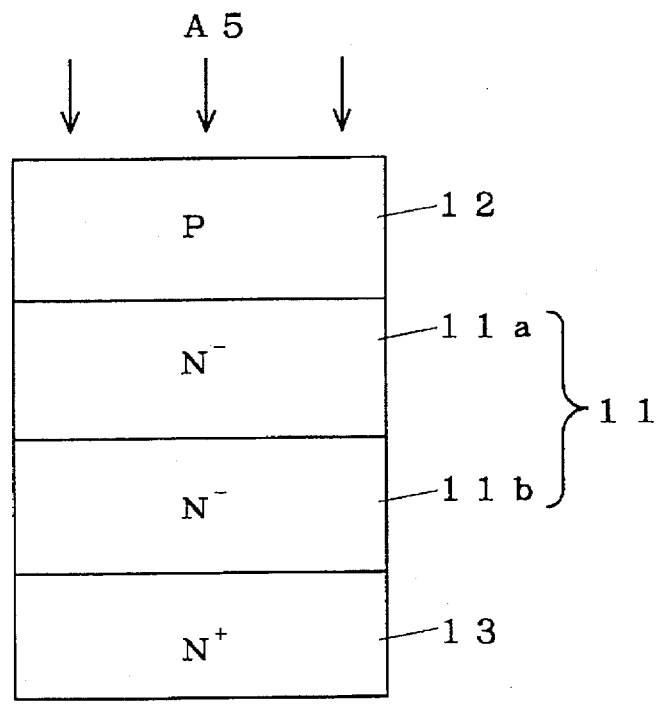
FIGS. 19 and 20 are sectional views showing a step in a method of fabricating a semiconductor device according to a ninth embodiment of the present invention.

First, the steps shown in FIGS. 11 and 12 are carried out similarly to the fifth embodiment. Then, a corpuscular beam of proton, helium, deuterium or the like is applied from an upper major surface side of a P layer 12 through this P layer 12, to be stopped in a portion of an $N^-$ layer 11 close to an $N^+$ layer 13 (FIG. 19, arrows A5). Thus, the $N^-$ layer 11 is brought into a multilayer structure of a first region 11a corresponding to a passage portion of the corpuscular beam and having a relatively small damage density, and a second region 11b corresponding to a portion close to a stop position of the corpuscular beam, i.e., in the vicinity of a peak position of the damage density.

Figure 20:
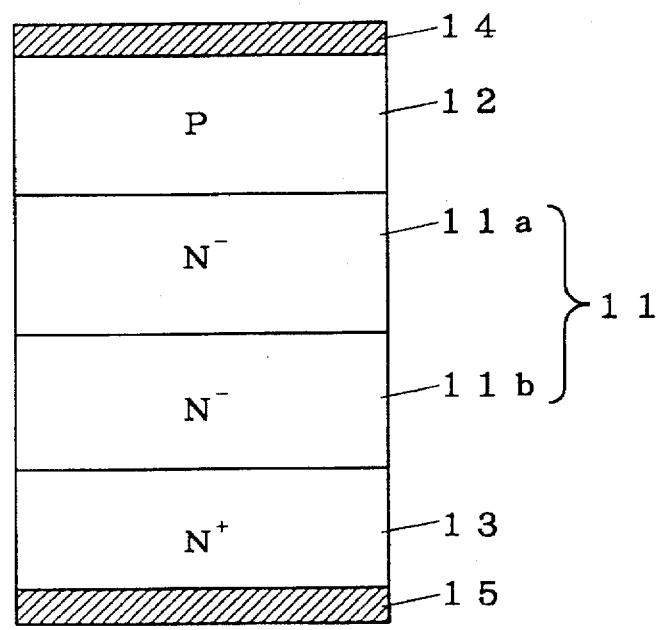

Thereafter an anode electrode 14 is formed on the upper major surface of the P layer 12, while a cathode electrode 15 is formed on a lower major surface of the $N^+$ layer 13, as shown in FIG. 20. The corpuscular beam may alternatively be applied after formation of the anode and cathode electrodes 14 and 15, as described with reference to the fifth embodiment.

The diode 30 shown in the third embodiment can be formed in the aforementioned manner.

(b-6) Tenth Embodiment:

A tenth embodiment also presents a method of fabricating the diode 30 shown in the third embodiment.

Figure 21:
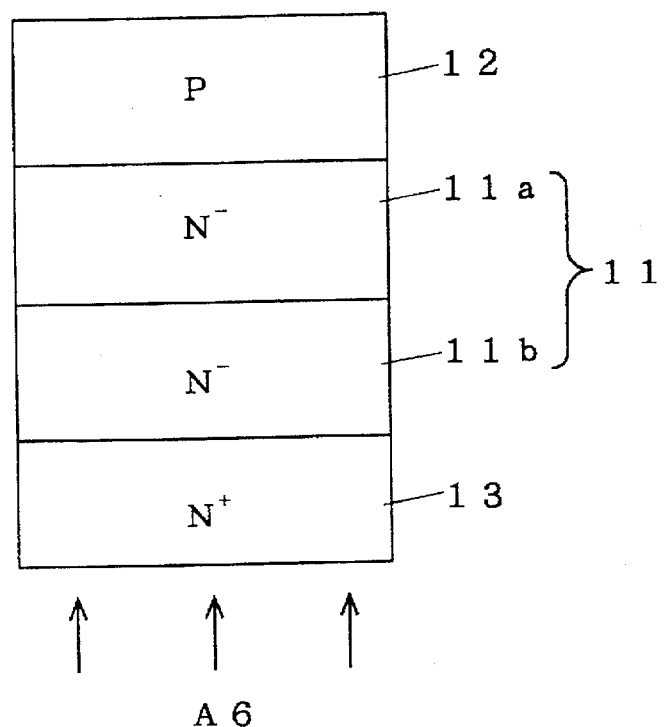
FIG. 21 is a sectional view showing a step in a method of fabricating a semiconductor device according to a tenth embodiment of the present invention.

First, the steps shown in FIGS. 11 and 12 are carried out similarly to the fifth embodiment. Then, a corpuscular beam of proton, helium, deuterium or the like is applied from a lower major surface side of an $N^+$ layer 13 through this $N^+$ layer 13, to be stopped in a portion of an $N^-$ layer 11 which is close to the $N^+$ layer 13 (FIG. 21, arrows A6). Thus, the $N^-$ layer 11 is brought into a multilayer structure of a first region 11a corresponding to a portion not irradiated with the corpuscular beam with no damage by the corpuscular beam, and a second region 11b corresponding to a portion close to a stop position of the corpuscular beam, i.e., in the vicinity of a peak position of the damage density.

Thereafter an anode electrode 14 is formed on an upper major surface of a P layer 12, while a cathode electrode 15 is formed on the lower major surface of the $N^+$ layer 13, as shown in FIG. 20. The corpuscular beam may alternatively be applied after formation of the anode and cathode electrodes 14 and 15, as described with reference to the fifth embodiment.

The diode 30 shown in the third embodiment can be formed in the aforementioned manner.

Particularly when the diode 30 is formed by the method shown in the tenth embodiment, spreading of a depletion layer is not inhibited in the first region 11a since the first region 11a is not damaged by the corpuscular beam. Therefore, withstand voltage reduction of the diode 30 can be suppressed as compared with the case of forming the diode 30 through the method shown in the ninth embodiment.

(b-7) Eleventh Embodiment:

An eleventh embodiment presents a method of fabricating the diode 40 shown in the fourth embodiment.

Figure 22:
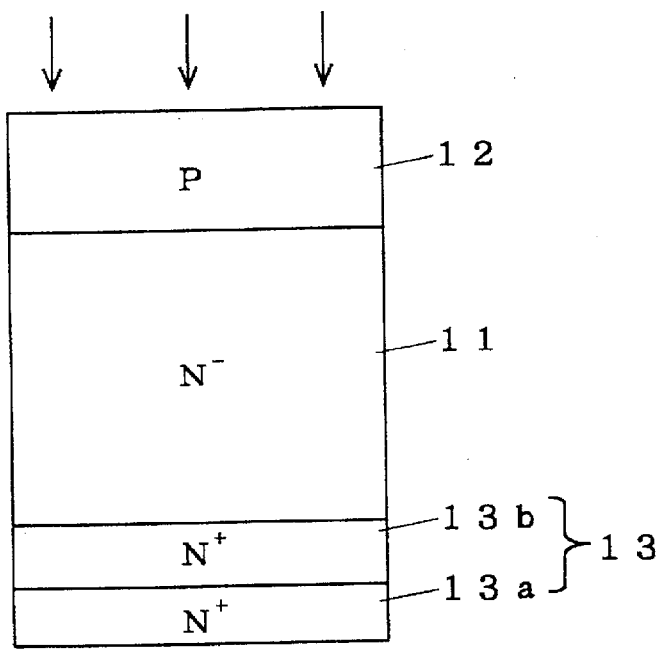
FIGS. 22 and 23 are sectional views showing a step in a method of fabricating a semiconductor device according to an eleventh embodiment of the present invention.

First, the steps shown in FIGS. 11 and 12 are carried out similarly to the fifth embodiment. Then, a corpuscular beam of proton, helium, deuterium or the like is applied from an upper major surface side of a P layer 12 through this P layer 12, to be stopped in a position of an $N^+$ layer 13 close to an $N^-$ layer 11 (FIG. 22, arrows A7). Thus, the $N^+$ layer 13 is brought into a multilayer structure of a first region 13a corresponding to a portion not irradiated with the corpuscular beam with no damage by the corpuscular beam, and a second region 13b corresponding to a portion close to a stop position of the corpuscular beam, i.e., in the vicinity of a peak position of the damage density.

Figure 23:
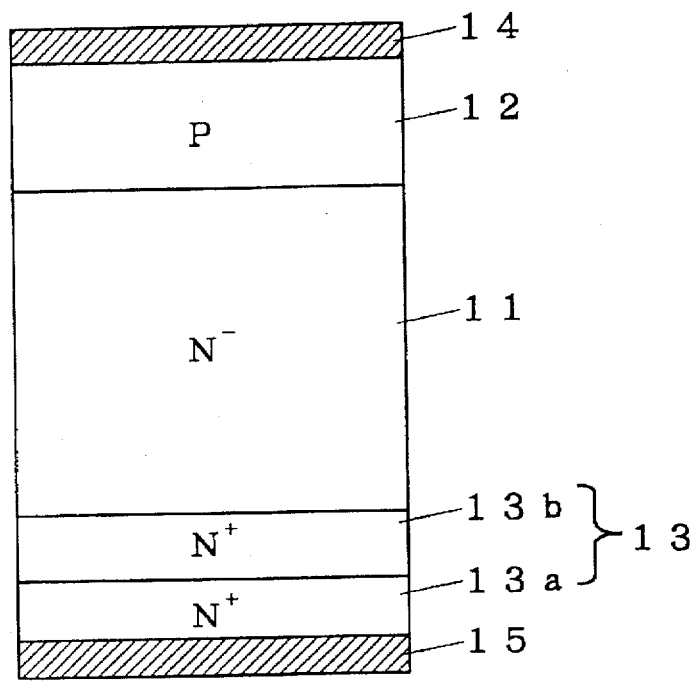

Thereafter an anode electrode 14 is formed on the upper major surface of the P layer 12, while a cathode electrode 15 is formed on a lower major surface of the $N^+$ layer 13, as shown in FIG. 23. The corpuscular beam may alternatively be applied after formation of the anode and cathode electrodes 14 and 15, as described with reference to the fifth embodiment.

The diode 40 shown in the fourth embodiment can be formed in the aforementioned manner.

(b-8) Twelfth Embodiment:

A twelfth embodiment also presents a method of fabricating the diode 40 shown in the fourth embodiment.

Figure 24:
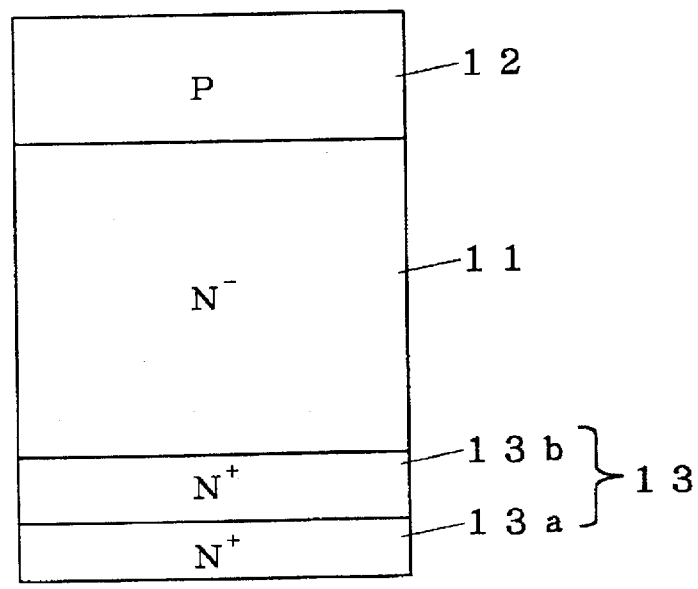
FIG. 24 is a sectional view showing a step in a method of fabricating a semiconductor device according to a twelfth embodiment of the present invention.
Figure 25:
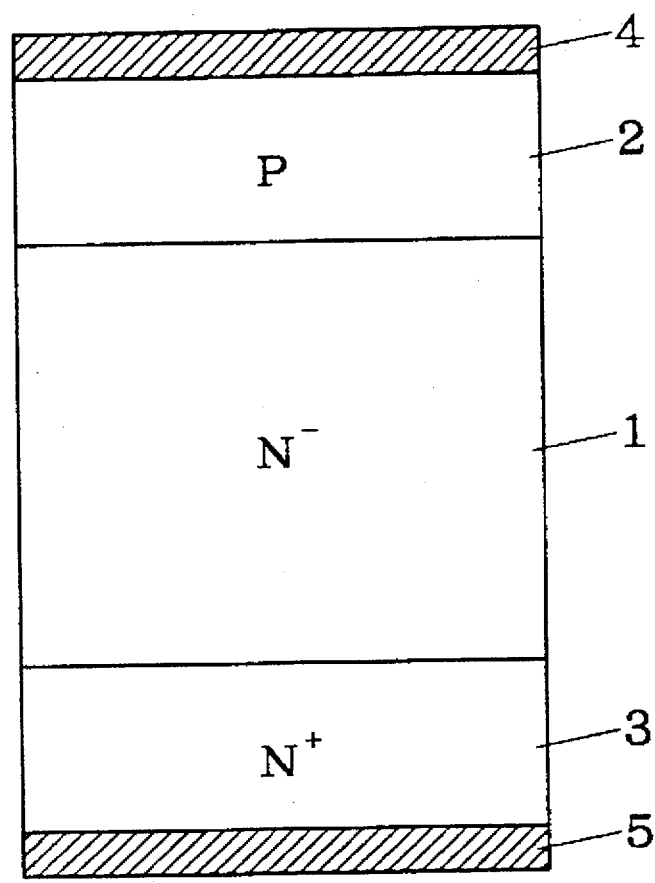
FIG. 25 is sectional view showing the structure of a diode 100 which is a conventional semiconductor device.
Figure 26:
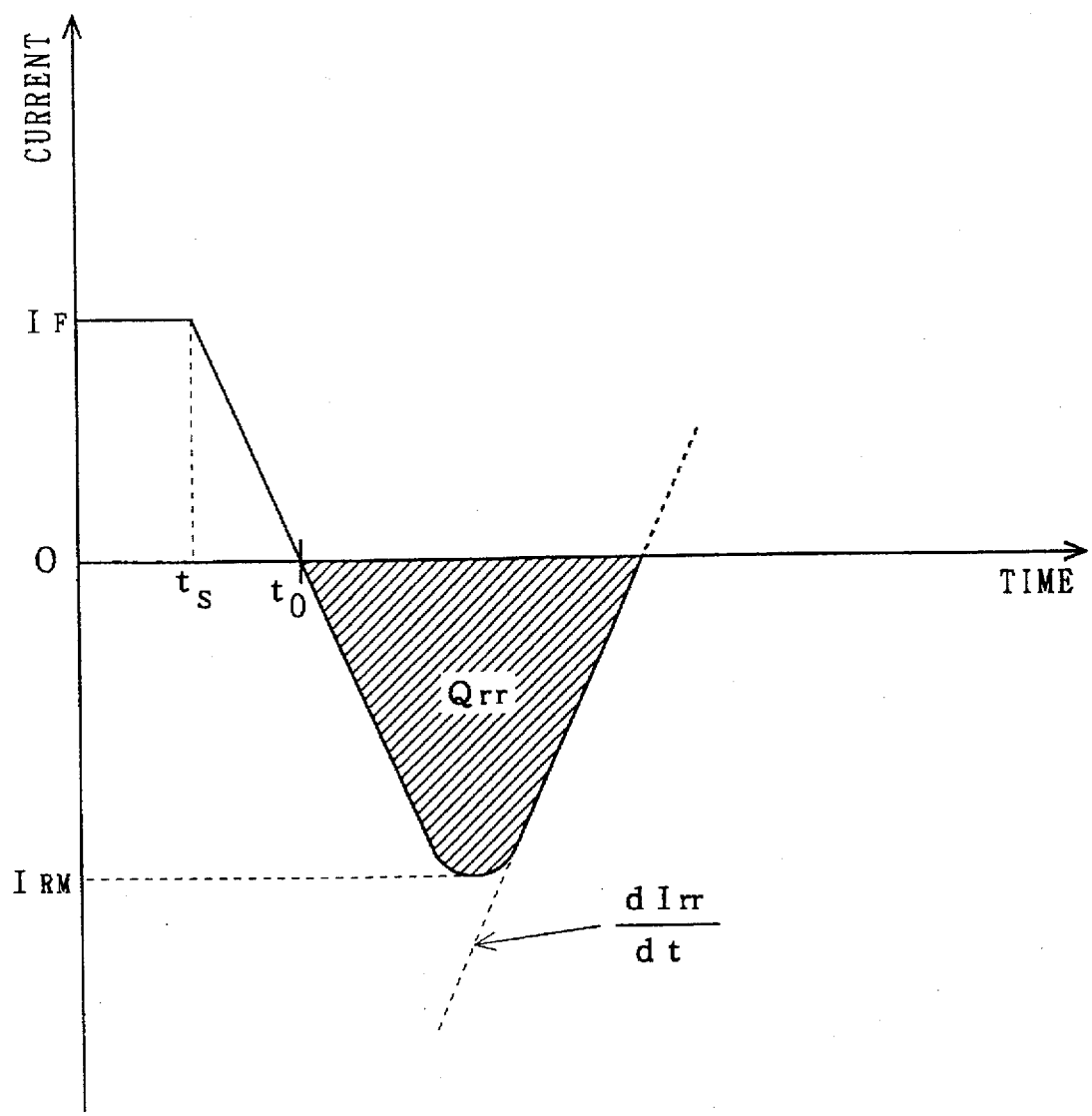
FIG. 26 is a graph showing an operating current waveform of the diode 100.
Figure 27:
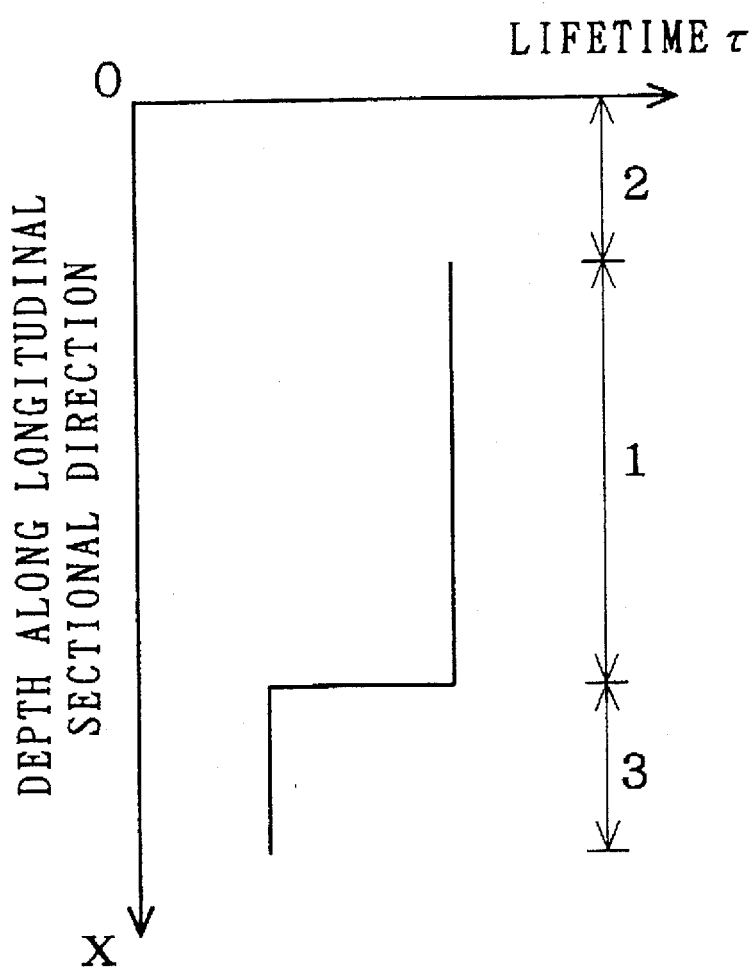
FIG. 27 is a model diagram showing lifetime distributions of an $N^-$ layer 1 and an $N^+$ substrate 3 along the longitudinal sectional direction of the diode 100.

First, the steps shown in FIGS. 11 and 12 are carried out similarly to the fifth embodiment. Then, a corpuscular beam of proton, helium, deuterium or the like is applied from a lower major surface side of an $N^+$ layer 13 through this $N^+$ layer 13, to be stopped in a position of the $N^+$ layer 13 which is close to an $N^-$ layer 11 (FIG. 24, arrows A8). Thus, the $N^+$ layer 13 is brought into a multilayer structure of a first region 13a corresponding to a passage portion of the corpuscular beam and having a relatively small damage density, and a second region 13b corresponding to a portion close to a stop position of the corpuscular beam, i.e., in the vicinity of a peak position of the damage density.

Thereafter an anode electrode 14 is formed on an upper major surface of a P layer 12, while a cathode electrode 15 is formed on the lower major surface of the N⁺ layer 13, as shown in FIG. 23. The corpuscular beam may alternatively be applied after formation of the anode and cathode electrodes 14 and 15, as described with reference to the fifth embodiment.

The diode 40 shown in the fourth embodiment can be formed in the aforementioned manner.

Particularly when the diode 40 is formed by the method shown in the twelfth embodiment, spreading of a depletion layer is not inhibited in the N⁻ layer 11 since the N⁻ layer 11 is not damaged by the corpuscular beam. Therefore, withstand voltage reduction of the diode 40 can be suppressed as compared with the case of forming the diode 40 through the method shown in the eleventh embodiment.

(b-9) Thirteenth Embodiment:

A thirteenth embodiment of the present invention presents a technique which is applied to each of the methods of fabricating semiconductor devices shown in the fifth to twelfth embodiments.

First, the steps shown in FIGS. 11 and 12 are carried out similarly to the fifth embodiment. Thereafter application of stopping a corpuscular beam in a semiconductor layer or two semiconductor layers is carried out similarly to those shown in the fifth to twelfth embodiments.

Then, a corpuscular beam of proton, helium, deuterium or the like is applied from the upper major surface side of the P layer 12 or the lower major surface side of the N⁺ layer 13 at high energy, to be completely passed through the entire semiconductor layers forming the diode 10, 20, 30 or 40.

Thus, lattice defects are uniformly supplied to the entire semiconductor layers, and uniform lifetime control is superposed in addition to the local lifetime control. Therefore, it is possible to further reduce the reverse recovery charge $Q_{rr}$ by further reducing the lifetime of the diode 10, 20, 30 or 40.

Thereafter the anode electrode 14 is formed on the upper major surface of the P layer 12 while the cathode electrode 15 is formed on the lower major surface of the N⁺ layer 13, as shown in FIG. 14, 17, 20 or 23. The step of applying the corpuscular beam at high energy can be exchanged with the step of applying the corpuscular beam to be stopped in a semiconductor layer or two semiconductor layers, as a matter of course. Further, the step of applying the corpuscular beam to be stopped in a semiconductor layer or two semiconductor layers or the corpuscular beam at high energy may alternatively be carried out after formation of the anode and cathode electrodes 14 and 15.

The aforementioned step of applying the corpuscular beam at high energy can be replaced by a step of applying a radiation such as an electron beam or the like and completely passing the same through the entire semiconductor layers.

(b-10) Fourteenth Embodiment:

A fourteenth embodiment of the present invention also presents a technique which is applied to each of the methods of fabricating semiconductor devices shown in the fifth to twelfth embodiments.

First, the steps shown in FIGS. 11 and 12 are carried out similarly to the fifth embodiment. Then, diffusion of a heavy metal such as gold or platinum or the like is carried out in the entire semiconductor layers. Thus, uniform lifetime control is performed.

Thereafter application of stopping a corpuscular beam in a semiconductor layer or two semiconductor layers is carried out similarly to those shown in the fifth to twelfth embodiments. Thus, local lifetime control is superposed in addition to the uniform lifetime control. Therefore, it is possible to further reduce the reverse recovery charge $Q_{rr}$ by further reducing the lifetime of the diode 10, 20, 30 or 40.

Thereafter the anode electrode 14 is formed on the upper major surface of the P layer 12 while the cathode electrode 15 is formed on the lower major surface of the N⁺ layer 13, as shown in FIG. 14, 17, 20 or 23. The formation of the anode and cathode electrodes 14 and 15 may alternatively be performed after the diffusion of the heavy metal, as a matter of course. The diffusion of the heavy metal is performed at a very high temperature. Therefore, if the process of applying a corpuscular beam is carried out before the step of diffusing the heavy metal, the damage which has been formed by the corpuscular beam is excessively annealed by the high temperature during the metal diffusion to be changed back to the original state, and the effect of the corpuscular beam is thus lost. Therefore, the order of performing these two steps is not changed.

C: Modifications:

(c-1) First Modification:

In the techniques shown in the first to fourteenth embodiments, effects similar to those of the aforementioned embodiments can be attained also in structures exchanging conductivity types of the entire semiconductor layers.

(c-2) Second Modification:

In relation to each of the fifth to fourteenth embodiments, the N⁻ layer 11 may be first prepared so that an N-type impurity is introduced onto its lower major surface by ion implantation or diffusion, to form the N⁺ layer 13 in the step shown in FIG. 11. The subsequent steps can be progressed similarly to each of the methods described with reference to the fifth to fourteenth embodiments.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   (a) a first conductivity type first semiconductor layer including first and second major surfaces and having a first impurity concentration;
   (b) a second conductivity type second semiconductor layer being provided on said first major surface of said first semiconductor layer;
   (c) a first conductivity type third semiconductor layer being provided on said second major surface of said first semiconductor layer and having a second impurity concentration being higher than said first impurity concentration;
   (d) a first electrode layer being in contact with said second semiconductor layer; and
   (e) a second electrode layer being in contact with said third semiconductor layer,
   said first semiconductor layer being provided with:
      (a-1) a first region being in contact with said second semiconductor layer and having a first lifetime,
      (a-2) a second region being provided between said first region and said third semiconductor layer to be in contact with said first region and having a second lifetime being smaller than said first lifetime, and
      (a-3) a third region being provided between said second region and said third semiconductor layer and having a third lifetime being larger than said first lifetime.

2. A semiconductor device comprising:
(a) a first conductivity type first semiconductor layer including first and second major surfaces and having a first impurity concentration;
(b) a second conductivity type second semiconductor layer being provided on said first major surface of said first semiconductor layer;
(c) a first conductivity type third semiconductor layer being provided on said second major surface of said first semiconductor layer and having a second impurity concentration being higher than said first impurity concentration;
(d) a first electrode layer being in contact with said second semiconductor layer; and
(e) a second electrode layer being in contact with said third semiconductor layer,
said first semiconductor layer being provided with:
   (a-1) a first region being in contact with said second semiconductor layer and having a first lifetime, and
   (a-2) a second region being provided between and in contact with said first region and said third semiconductor layer and having a second lifetime being smaller than said first lifetime,
said third semiconductor layer being provided with,
   (c-1) a third region being in contact with said second electrode layer and having a third lifetime, and
   (c-2) a fourth region being provided between and in contact with said first semiconductor layer and said third region and having a fourth lifetime being smaller than said third lifetime.

3. A semiconductor device comprising:
(a) a first conductivity type first semiconductor layer including first and second major surfaces and having a first impurity concentration;
(b) a second conductivity type second semiconductor layer being provided on said first major surface of said first semiconductor layer;
(c) a first conductivity type third semiconductor layer being provided on said second major surface of said first semiconductor layer and having a second impurity concentration being higher than said first impurity concentration;
(d) a first electrode layer being in contact with said second semiconductor layer; and
a second electrode layer being in contact with said third semiconductor layer,
said first semiconductor layer being provided with,
   (a-1) a first region being in contact with said second semiconductor layer and having a first lifetime, and
   (a-2) a second region being provided between and in contact with said first region and said third semiconductor layer and having a second lifetime being smaller than said first lifetime.

4. A semiconductor device comprising:
(a) a first conductivity type first semiconductor layer including first and second major surfaces and having a first impurity concentration;
(b) a second conductivity type second semiconductor layer being provided on said first major surface of said first semiconductor layer;
(c) a first conductivity type third semiconductor layer being provided on said second major surface of said first semiconductor layer and having a second impurity concentration being higher than said first impurity concentration;
(d) a first electrode layer being in contact with said second semiconductor layer; and
(e) a second electrode layer being in contact with said third semiconductor layer,
said third semiconductor layer being provided with,
   (c-1) a first region being in contact with said second electrode layer and having a first lifetime, and
   (c-2) a second region being provided between and in contact with said first semiconductor layer and said first region and having a second lifetime being smaller than said first lifetime.

* * * * *

UNITED STATES PATENT AND TRADEMARK OFFICE
CERTIFICATE OF CORRECTION

PATENT NO. : 5,717,244
DATED : February 10, 1998
INVENTOR(S) : SOEJIMA

Page 1 of 4

It is certified that error appears in the above-identified patent and that said Letters Patent is hereby corrected as shown below:

In the Abstract:

Line 10, change "$V_f$" to --$V_F$--.

Column 1, line 26, change "$I_n$" to --$I_{rr}$--;

line 28, change "$dI_{90}/dt$" to --$dI_{rr}/dt$--;

line 29, change "$I_n$" to --$I_{rr}$--;

line 32, change "$I_n$" to --$I_{rr}$--;

line 34, change "$V_{surge}=-L-\bullet(dI_n/dt)$" to --$V_{surge}=-L\bullet(dI_{rr}/dt)$--;

line 39, change "$dI_n/dt$" to --$dI_{rr}/dt$-- and change "$I_n$" to --$I_{rr}$--;

line 43, change "$dI_n/dt$" to --$dI_{rr}/dt$--;

line 48, change "$Q_n$" to --$Q_{rr}$--;

line 50, change "$I_{90}$" to --$I_{rr}$--;

line 58, change "$I_n$" to --$I_{rr}$--;

line 59, change "$Q_n$" to --$Q_{rr}$--;

UNITED STATES PATENT AND TRADEMARK OFFICE
CERTIFICATE OF CORRECTION

PATENT NO. : 5,717,244
DATED : February 10, 1998
INVENTOR(S) : SOEJIMA

It is certified that error appears in the above-identified patent and that said Letters Patent is hereby corrected as shown below:

Column 2, line 8, change "$Q_n$" to --$Q_{rr}$--;

line 16, change "$Q_n$" to --$Q_{rr}$--.

Column 12, line 59, change "$dI_n/dt$" to --$dI_{rr}/dt$--;

Column 13, line 6, change "$Q_n$" to --$Q_{rr}$--;

line 9, change $I_n$" to --$I_{rr}$-- and change "$Q_n$" to --$Q_{rr}$--;

line 11, change "$Q_n$" to --$Q_{rr}$--;

line 15, change "$Q_n$" to --$Q_{rr}$--.

Column 14, line 36, change "$I_{96}$" to --$I_{rr}$--;

line 37, change "$Q_{96}$" to --$I_{rr}$--;

line 45, change "$Q_n$" to --$Q_{rr}$--;

line 53, change "$Q_n$" to --$Q_{rr}$--;

line 60, change "$\tau_2 21 \tau_1$" to --$\tau_2 < \tau_1$--.

Column 15, line 16, change "$Q_n$" to --$Q_{rr}$--;

UNITED STATES PATENT AND TRADEMARK OFFICE
CERTIFICATE OF CORRECTION

PATENT NO. : 5,717,244
DATED : February 10, 1998
INVENTOR(S) : Soejima

It is certified that error appears in the above-identified patent and that said Letters Patent is hereby corrected as shown below:

Column 15, line 27, change "$Q_n$" to --$Q_{rr}$--;

line 30, change "$V_v$" to --$V_F$--;

line 31, change "$Q_n$" to --$Q_{rr}$--;

line 61, change "$I_n$" to --$I_{rr}$--;

line 62, change "$Q_n$" to --$Q_{rr}$--.

line 67, change "$Q_n$" to --$Q_{rr}$--.

Column 16, line 2, change "$Q_n$" to --$Q_{rr}$--;

line 9, change "$Q_n$" to --$Q_{rr}$--;

line 62, change "$I_n$" to --$I_{rr}$--;

line 63, change "$Q_n$" to --$Q_{rr}$--.

Column 17, line 1, change "$Q_n$" to --$Q_{rr}$--;

line 3, change "$Q_n$" to --$Q_{rr}$--;

line 10, change "$Q_n$" to --$Q_{rr}$--.

Column 18, line 26, change "$Q_n$" to --$Q_{rr}$--.

UNITED STATES PATENT AND TRADEMARK OFFICE
CERTIFICATE OF CORRECTION

PATENT NO. : 5,717,244
DATED : February 10, 1998
INVENTOR(S) : SOEJIMA

It is certified that error appears in the above-identified patent and that said Letters Patent is hereby corrected as shown below:

Column 19, line 4, change "$N^{30}$" to --$N^+$--;

line 6, change "$N^{30}$" to --$N^+$--.

Column 21, line 36, change "$Q_n$" to --$Q_{rr}$--.

Column 22, line 4, change "$Q_n$" to --$Q_{rr}$--.

Signed and Sealed this

Sixth Day of October, 1998

*Attest:*

BRUCE LEHMAN

*Attesting Officer*     *Commissioner of Patents and Trademarks*